US007990609B2

(12) United States Patent
Omura

(10) Patent No.: US 7,990,609 B2
(45) Date of Patent: Aug. 2, 2011

(54) CATADIOPTRIC IMAGING SYSTEM WITH PROLATE SPHEROIDAL-SHAPED MIRRORS

(75) Inventor: Yasuhiro Omura, Kounosu (JP)

(73) Assignee: Nikon Corporation, Tokyo (JP)

( * ) Notice: Subject to any disclaimer, the term of this patent is extended or adjusted under 35 U.S.C. 154(b) by 66 days.

(21) Appl. No.: 12/219,866

(22) Filed: Jul. 29, 2008

(65) Prior Publication Data

US 2009/0027768 A1    Jan. 29, 2009

Related U.S. Application Data

(63) Continuation of application No. PCT/JP2006/325711, filed on Dec. 25, 2006.

(30) Foreign Application Priority Data

Jan. 30, 2006    (JP) ................................. 2006-020516

(51) Int. Cl.
    *G02B 17/08*    (2006.01)
    *G03B 27/52*    (2006.01)
    *G03B 27/70*    (2006.01)

(52) U.S. Cl. ........................................ 359/365

(58) Field of Classification Search ........................ None
    See application file for complete search history.

(56) References Cited

U.S. PATENT DOCUMENTS 6,142,641 A * 11/2000 Cohen et al. .................. 359/859
7,446,952 B2 * 11/2008 Epple ............................ 359/731

2005/0111084 A1    5/2005 Mandella
2006/0012885 A1 *  1/2006 Beder et al. .................. 359/649
2006/0121364 A1    6/2006 Omura

FOREIGN PATENT DOCUMENTS

JP    2004-333761    11/2004
JP    2005-233979    9/2005
WO    2005/069055 A2    7/2005

OTHER PUBLICATIONS

English translation of the International Preliminary Report on Patentability, dated Aug. 14, 2008.
European Patent Application issued May 12, 2009 in corresponding European Patent Application 06835158.4.
International Search Report mailed Apr. 10, 2007 in connection with International Application No. PCT/JP2006/325711.

* cited by examiner

*Primary Examiner* — Mark Consilvio

(57) ABSTRACT

A catadioptric imaging optical system of a high numerical aperture in which various aberrations are properly corrected without using a reflection surface having an aspherical shape of high order or a reciprocal optical element. The catadioptric imaging optical system forms an image of a first plane on a second plane and includes a first imaging system for forming a first intermediate image of the first plane based on light from the first plane, a second imaging system having two concave reflection mirrors for forming a second intermediate image of the first plane based on light from the first intermediate image, and a third imaging system for forming a final image of the first plane on the second plane based on light from the second intermediate image. The two concave reflection mirrors have prolate spheroidal-shaped reflection surfaces.

41 Claims, 15 Drawing Sheets

CATADIOPTRIC IMAGING SYSTEM WITH PROLATE SPHEROIDAL-SHAPED MIRRORS

This application is a continuation application filed under 35 U.S.C. 111(a) claiming the benefit under 35 U.S.C. 120 and 365(c) of PCT International application number PCT/JP2006/325711 filed on Dec. 25, 2006, which claimed priority to Japanese application number 2006-020516 filed Jan. 30, 2006, in the Japanese Patent Office, the disclosures of which is hereby incorporated by reference.

BACKGROUND OF THE INVENTION

One embodiment of the present invention relates to catadioptric imaging optical system, exposure apparatus, and a device manufacturing method, and more particularly, to a projection optical system optimal for use in an exposure apparatus employed for manufacturing a micro-device such as a semiconductor element and a liquid crystal display element in a photolithography process.

In a photolithography process for manufacturing a semiconductor element or the like, an exposure apparatus is used to project and expose a pattern image of a mask (or reticle) on a photosensitive substrate (wafer, glass plate, or the like that is coated with photoresist) with a projection optical system. In an exposure apparatus, the projection optical system is required to have a higher resolving power (resolution) since integration of semiconductor elements and the like has become higher. The wavelength $\lambda$ of the illumination light (exposure light) must be shortened and the image side numerical aperture NA of the projection optical system must be enlarged to satisfy the requirements for the resolving power of the projection optical system. Accordingly, a liquid immersion technique is known to increase the image side numerical aperture by filling an optical path between the projection optical system and the photosensitive substrate with a medium such as liquid having a high refractive index.

Generally, in a projection optical system having a large image side numerical aperture, the employment of a catadioptric imaging optical system is desirable from the viewpoint in which the Petzval condition can be satisfied and flatness of an image can be obtained even in a dry system without being limited to the liquid immersion system. Further, the employment of an off-axis field imaging optical system in which an effective field of view (ultimately, an effective imaging region) does not include an optical axis is desirable from the viewpoint in which it can be applied to any fine pattern. In International Publication Pamphlet No. WO2005/069055, a thrice imaging type optical system including two reflection mirrors has been proposed as an off-axis field catadioptric imaging optical system optimal for use in an exposure apparatus.

SUMMARY OF THE INVENTION

In the conventional catadioptric imaging optical system disclosed in International Publication Pamphlet No. WO2005/069055, the off-axis field and the optical axis do not need to be greatly spaced apart. Thus, a rectangular effective imaging region can be easily obtained. However, in the prior art described in International Publication Pamphlet No. WO2005/069055, to correct the spherical aberration of the pupil of a second imaging system, a higher-order aspheric surface is used as a reflection mirror that configures the second imaging system. Otherwise, a reciprocal optical element (optical element in which light enters and exits for a number of times) is used between two reflection mirrors in the second imaging system. This is because sufficient correction of telecentricity and distortion (distortion aberration) becomes difficult when the spherical aberration of a pupil becomes so large at a pupil plane of the second imaging system that it cannot be compensated for by a first imaging system and third imaging system.

Generally, the surface measurement technique that is implemented when processing a higher-order aspheric surface is complicated. Further, accurate manufacturing of a reflection mirror with a reflection surface having an aspherical shape of a high order becomes difficult. In comparison with a refraction surface, the contribution of a reflection surface to wave aberration is about four times greater and the contribution of a reflection surface to flare light quantity is about thirteen times greater. Therefore, the use of a higher-order aspheric surface as a reflection surface is not undesirable in photolithography that realizes the resolving power of, for example 100 nm or less. When the reciprocal optical element is arranged between two reflection mirrors in the second imaging system, light is transmitted through the reciprocal optical element three times. Thus, the imaging performance of the optical system is apt to fluctuate greatly due to absorption of exposure light by the reciprocal optical element. Further, when enlarging an exposure region (effective imaging region), the reciprocal optical element would most likely have to be enlarged, which, in turn, would enlarge the optical system.

An embodiment of the present invention provides a catadioptric imaging optical system of a high numerical aperture, in which various aberrations are properly corrected without using a reflection surface having an aspherical shape of a high order or a reciprocal optical element. Another embodiment of the present invention provides an exposure apparatus capable of projecting and exposing a fine pattern reliably with high accuracy using a catadioptric imaging optical system of a high numerical aperture in which various aberrations are properly corrected.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

A first embodiment of the present invention provides a catadioptric imaging optical system for forming an image of a first plane on a second plane. The catadioptric imaging optical system includes a first imaging system which forms a first intermediate image of the first plane based on light from the first plane. A second imaging system includes two concave reflection mirrors and forms a second intermediate image of the first plane based on light from the first intermediate image. A third imaging system forms a final image of the first plane on the second plane based on light from the second intermediate image. At least one of the two concave reflection mirrors includes a prolate spheroidal-shaped reflection surface. In the present invention, a prolate spheroidal-shaped surface refers to the surface of a spheroid of which long axis coincides with an optical axis, the surface being expressed by the after-mentioned equation (b) with a conical coefficient $\kappa$ satisfying a condition of $-1<\kappa<0$.

A second embodiment of the present invention provides a catadioptric imaging optical system for forming an image of a first plane on a second plane. The catadioptric imaging optical system includes a first imaging system which forms a first intermediate image of the first plane based on light from the first plane, a second imaging system which includes two concave reflection mirrors and which forms a second intermediate image of the first plane based on light from the first intermediate image, and a third imaging system which forms a final image of the first plane on the second plane based on light from the second intermediate image. The two concave reflection mirrors include identically shaped reflection surfaces.

A third embodiment of the present invention is an off-axis field catadioptric imaging optical system for forming an image of a first plane on a second plane only in a region distant from an optical axis. The off-axis field catadioptric imaging optical system includes two curved reflection mirrors and a plurality of dioptric elements. At least one of the two curved reflection mirrors includes a prolate spheroidal-shaped reflection surface. A fourth embodiment of the present invention is an exposure apparatus including the catadioptric imaging optical system of the first to third embodiments which projects an image of the pattern onto a photosensitive substrate set as the second plane based on light from a predetermined pattern set as the first plane. A fifth embodiment of the present invention is a device manufacturing method including exposing the predetermined pattern onto the photosensitive substrate using the exposure apparatus of the fourth embodiment and developing the photosensitive substrate that has undergone the exposing.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION OF THE PREFERRED EMBODIMENTS

Figure 1:
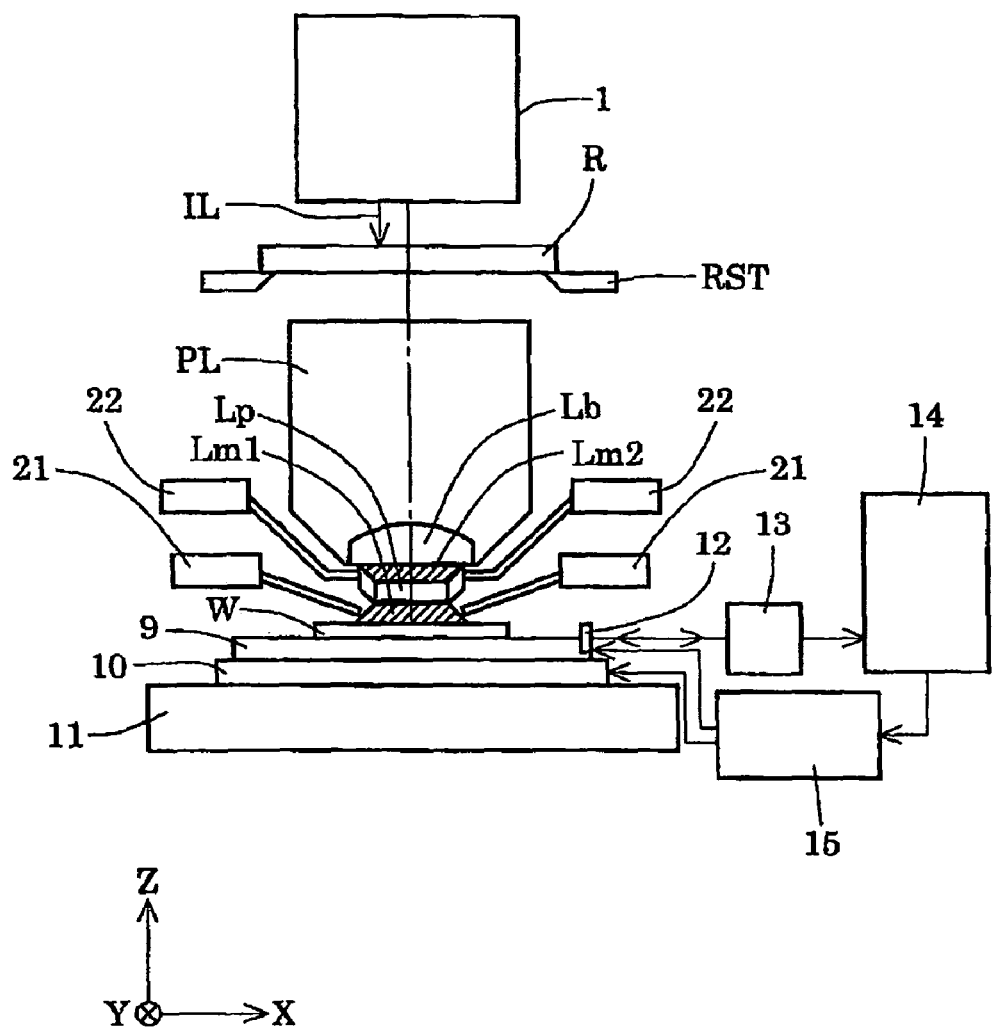
FIG. 1 is a schematic diagram showing the structure of an exposure apparatus according to one embodiment of the present invention.

One embodiment of the present invention will now be described with reference to the accompanying drawings. FIG. 1 is a schematic diagram showing the structure of an exposure apparatus according to one embodiment of the present invention. In FIG. 1, the X axis and Y axis are set in directions parallel to a wafer W, and the Z axis is set in a direction orthogonal to the wafer W. More specifically, an XY plane is set parallel to a horizontal plane, and the +Z axis is set to extend upward along a vertical direction. As shown in FIG. 1, the exposure apparatus of the present embodiment incorporates an illumination optical system 1 including, for example, an ArF excimer laser light source, which is an exposure light source, and is formed by an optical integrator (homogenizer), a field stop, a condenser lens, and the like.

Exposure light (exposure beam) IL, which includes ultraviolet pulse light having a wavelength of 193 nm and which is emitted from the light source, passes through the illumination optical system 1 and illuminates a reticle (mask) R. A pattern that is to be transferred is formed on the reticle R. In the entire pattern region, a rectangular (slit-shaped) pattern region having a long side extending along the X direction and a short side extending along the Y direction is illuminated. The light passing through the reticle R forms a reticle pattern with a predetermined reduction projection magnification on the exposure region of the wafer (photosensitive substrate) W, which is coated by a photoresist, through a projection optical system PL, which is a liquid immersion catadioptric imaging optical system. That is, a pattern image is formed in a rectangular static exposure region (effective exposure region; effective imaging region) having a long side extending along the X direction and a short side extending along the Y direction of the wafer W in optical correspondence with the rectangular illumination region on the reticle R.

Figure 2:
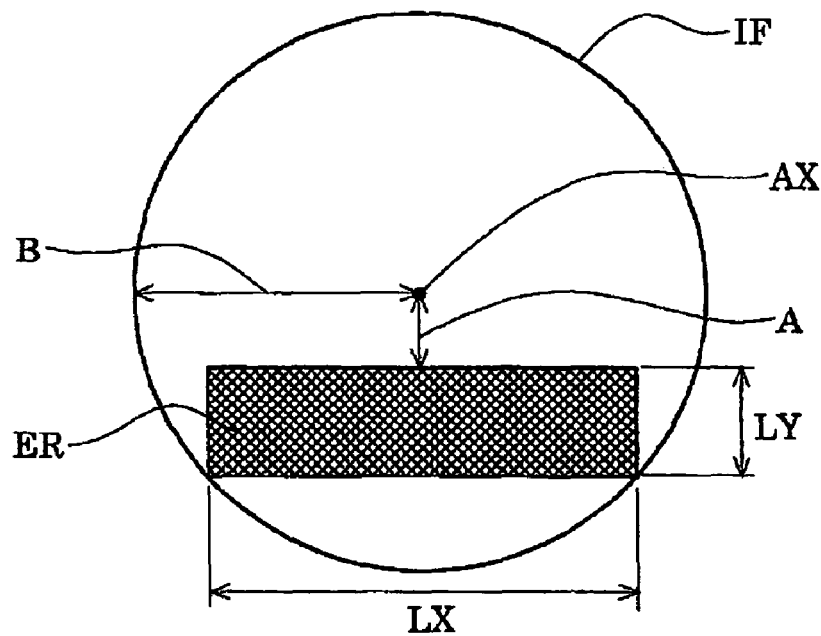
FIG. 2 is a diagram showing the positional relationship of a static exposure region, which is formed on a wafer, and an optical axis.
Figure 2:
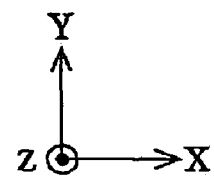

FIG. 2 is a diagram showing the positional relationship of the rectangular static exposure region (i.e., effective exposure region) formed on a wafer relative to an optical axis in the present embodiment. In the present embodiment, referring to FIG. 2, a rectangular effective exposure region ER is set in a circular region (image circle) IF having a radius B and a center coinciding with the optical axis AX. The effective exposure region ER has a desired size and is spaced from the optical axis AX in the Y direction by an off-axial distance A. The length in the X direction of the effective exposure region ER is LX, and the length in the Y direction is LY. Therefore, although not shown in the drawings, a rectangular illumination region (i.e., effective illumination region) having a size and a shape corresponding to the effective exposure region ER is formed on the reticle R at a position spaced apart from the optical axis AX in the Y direction by a distance corresponding to the off-axial distance A in correspondence with the rectangular effective exposure region ER.

The reticle R is held parallel to the XY plane on a reticle stage RST, and a mechanism for finely moving the reticle R in the X direction, the Y direction, and a rotation direction is incorporated in the reticle stage RST. A reticle laser interferometer (not shown) measures and controls in real time the position of the reticle stage RST in the X direction, the Y direction, and the rotation direction. The wafer W is fixed parallel to the XY plane on a Z stage 9 by a wafer holder (not shown). The Z stage 9, which is fixed on an XY stage 10 that moves along the XY plane substantially parallel to an image plane of the projection optical system PL, controls a focus position (position in Z direction) and inclination angle of the wafer W. A wafer laser interferometer 13, which uses a movable mirror 12 arranged on the Z stage 9, measures and controls in real time the position of the Z stage 9 in the X direction, the Y direction, and the rotation direction.

The XY stage 10 is mounted on a base 11 and controls the X direction, the Y direction, and the rotation direction of the wafer W. A main control system 14 arranged in the exposure apparatus of the present embodiment adjusts the position of the reticle R in the X direction, the Y direction, and the rotation direction based on the measurement of a reticle laser interferometer. In other words, the main control system 14 transmits a control signal to a mechanism incorporated in the reticle stage RST and adjusts the position of the reticle R by finely moving the reticle stage RST. The main control system 14 also adjusts the focus position (position in Z direction) and the inclination angle of the wafer W to align the surface of the wafer W with the image plane of the projection optical system PL by using an automatic focusing technique and an automatic leveling technique. That is, the main control system 14 transmits a control signal to a wafer stage drive system 15 and adjusts the focus position and the inclination angle of the wafer W by driving the Z stage 9 with the wafer stage drive system 15.

Furthermore, the main control system 14 adjusts the position of the wafer W in the X direction, the Y direction, and the rotation direction based on a measurement of the wafer laser interferometer 13. In other words, the main control system 14 transmits a control signal to the wafer stage drive system 15 and performs position adjustment in the X direction, the Y direction, and the rotation direction of the wafer W by driving the XY stage 10 with the wafer stage drive system 15. During exposure, the main control system 14 transmits a control signal to the mechanism incorporated in the reticle stage RST and also transmits a control signal to the wafer stage drive system 15 to project and expose the pattern image of the reticle R in a predetermined shot region of the wafer W while driving the reticle stage RST and the XY stage 10 at a speed ratio corresponding to the projection magnification of the projection optical system PL. Thereafter, the main control system 14 transmits a control signal to the wafer stage drive system 15 and drives the XY stage 10 with the wafer stage drive system 15 to step-move another shot region on the wafer W to the exposure position.

Figure 3A:
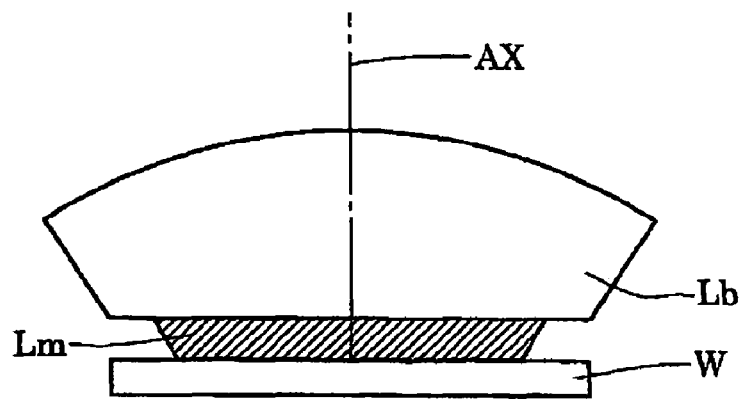
FIG. 3 is a diagram showing the structure between a boundary lens and a wafer in each example.
Figure 3B:
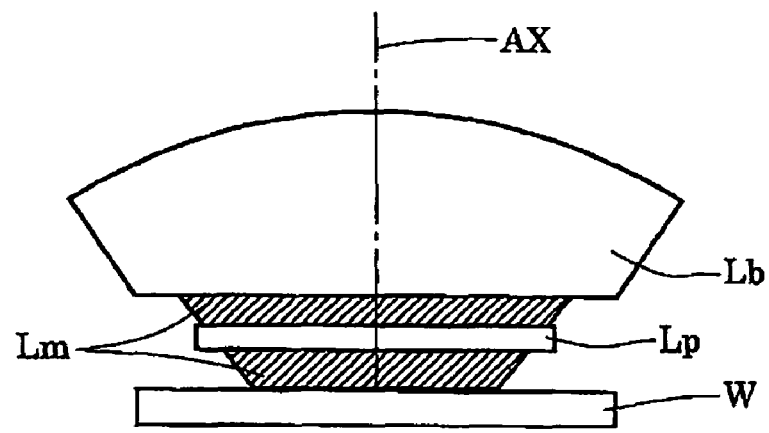

In this manner, step-and-scan is performed to repeat the operation for scanning and exposing the pattern image of the reticle R onto the wafer W. In the present embodiment, while controlling the positions of the reticle R and the wafer W using the wafer stage drive system 15, the wafer laser interferometer 13, the reticle stage RST and the XY stage 10, and ultimately, the reticle R and the wafer W, are synchronously moved (scanned) along the short side direction, that is, the Y direction, of the rectangular static exposure region and the still illumination region. This scans and exposes the reticle pattern to a region on the wafer W having a width equal to the long side LX of the static exposure region and a length corresponding to the scanning amount (movement amount) of the wafer W FIG. 3 is a schematic diagram showing the structure between a boundary lens and a wafer in each example of the present embodiment. In a first example, second example, third example, and fourth example of the present embodiment, an optical path between the boundary lens Lb and the wafer W is filled with liquid Lm, as shown in FIG. 3(a). In the third example of the present embodiment, the optical path between a plane-parallel plate Lp and the wafer W and between the boundary lens Lb and the plane-parallel plate Lp are filled with liquid Lm, as shown in FIG. 3(b). In the third example, pure water serving as the liquid Lm is circulated in the optical path between the plane-parallel plate Lp and the wafer W using a first water supply/discharge mechanism 21, and pure water serving as the liquid Lm is circulated in the optical path between boundary lens Lb and the plane-parallel plate Lp using a second water supply/discharge mechanism 22, as shown in FIG. 1. In the first example, second example, third example, and fourth example, pure water serving as the liquid Lm is circulated in the optical path between the boundary lens Lb and the wafer W using a water supply/discharge mechanism that is not shown in the drawings.

In each example of the present embodiment, the aspheric surface is expressed by the following equation (b), where y represents the height in a direction perpendicular to the optical axis, z represents the distance (sag amount) along the optical axis from a tangent plane at a vertex of a aspheric surface to a position on the aspheric surface at height y, r represents a vertex curvature radius, κ represents a conical coefficient, and $C_n$ represents an n order aspheric surface coefficient. In the (1) to (4), which will be described later, a * mark is added to the right side of a plane number for an optical surface having an aspherical shape.

$$z=(y^2/r)/[1+\{1-(1+\kappa)\cdot y^2/r^2\}^{1/2}]+C_4\cdot y^4+C_6\cdot y^6+C_8\cdot y^8+C_{10}\cdot y^{10}+C_{12}\cdot y^{12}+C_{14}\cdot y^{14}+C_{16}\cdot y^{16} \quad (b)$$

In each example of the present embodiment, the projection optical system PL includes a first imaging system G1, a second imaging system G2, and a third imaging system G3. The first imaging system G1 forms a first intermediate image of a pattern of the reticle R arranged on an object plane (first plane). The second imaging system G2 forms a second intermediate image of the reticle pattern (image of the first intermediate image, and secondary image of the reticle pattern) based on the light from the first intermediate image. The third imaging system G3 forms a final image (reduced image of the reticle pattern) of the reticle pattern on the wafer W arranged on the image plane (second plane) based on the light from the second intermediate image. The first imaging system G1 and the third imaging system G3 are both dioptric systems (optical systems that do not include a reflection mirror), and the second imaging system G2 is a catoptric system consisting of only two concave reflection mirrors. In the projection optical system PL of each example, the first imaging system G1, the second imaging system G2, and the third imaging system G3 are respectively arranged along a single optical axis AX linearly extending along the vertical direction. Further, in each example, the projection optical system PL is configured to be substantially telecentric to both the object side and the image side.

First Example

Figure 4:
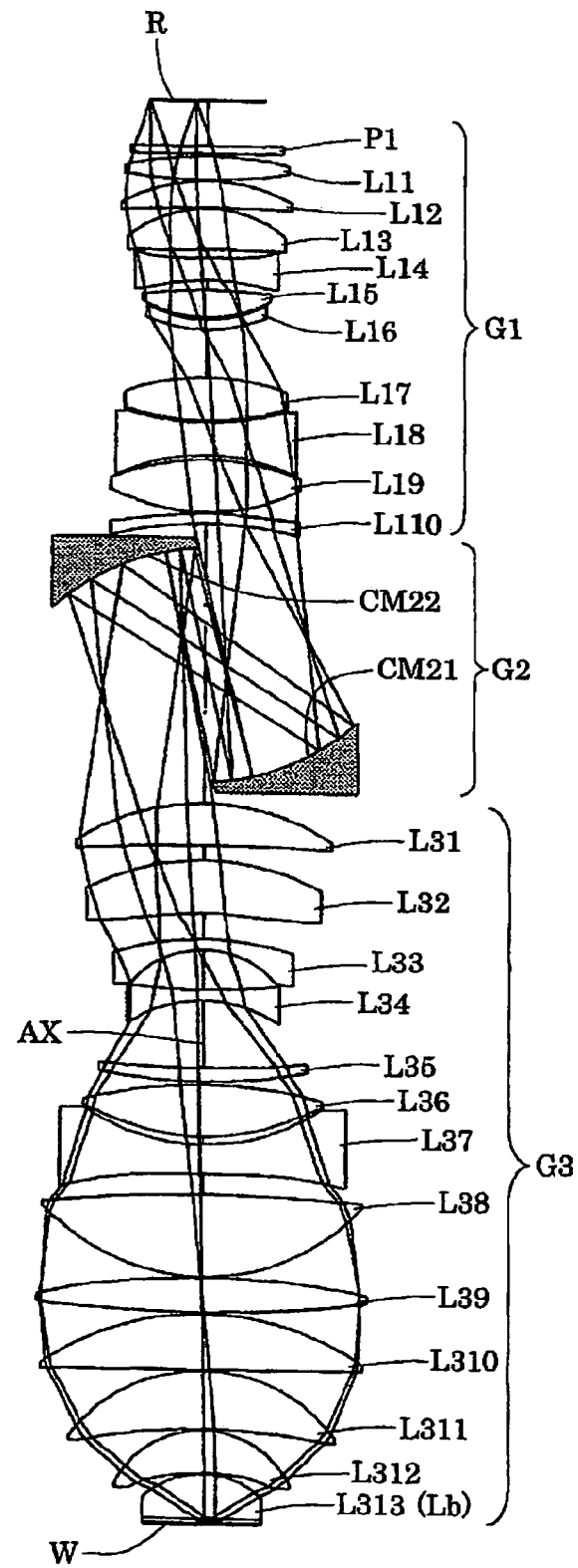
FIG. 4 is a diagram showing a lens structure of a projection optical system in a first example.

FIG. 4 is a diagram showing a lens structure of the projection optical system in the first example of the present embodiment. The first imaging system G1 in the projection optical system PL of the first example includes a plane-parallel plate P1 and ten lenses L11 to L110 from the reticle side. The second image system G2 includes a first concave reflection mirror CM21 and a second concave mirror CM22 from the incident side of light. The first concave reflection mirror CM21 has a prolate spheroidal concave surface facing the incident side (reticle side). The second concave mirror CM22 has a prolate spheroidal concave surface facing the incident side (wafer side) in order. More specifically, the prolate spheroidal-shaped reflection surface of the first concave reflection mirror CM21 and the prolate spheroidal-shaped reflection surface of the second concave reflection mirror CM22 respectively form parts of elliptical surfaces, each having a major axis on the optical axis AX. The first concave reflection mirror CM21 and the second concave reflection mirror CM22 have reflection surfaces with identical shapes. The first concave reflection mirror CM21 is arranged so that one focal point is located at a pupil position of the first imaging system G1 and the other focal point is located at a pupil position of the second imaging system G2. The second concave reflection mirror CM22 is arranged so that one focal point is located at a pupil position of the third imaging system G3, and the other focal point is located at the pupil position of the second imaging system G2.

The third imaging system G3 includes lenses L31 to L312 and a planar-convex lens L313 (boundary lens Lb) from the reticle side (i.e., light incident side). The planar-convex lens L313 has a plane facing the wafer side. In the first example, a variable aperture stop AS (not shown) for varying the numerical aperture of the projection optical system PL is arranged between the lens L39 and L310. The pure water (Lm) having a refractive index of 1.435876 with respect to the ArF excimer laser light (central wavelength $\lambda$=193.306 nm), which is the used light (exposure light), fills the optical path between the boundary lens Lb and the wafer W. All light transmissive members including the boundary lens Lb are made of silica ($SiO_2$) having a refractive index of 1.5603261 with respect to the central wavelength of the used light.

Values for the data of the projection optical system PL in the first example are shown in table (1). In table (1), $\lambda$ represents the central wavelength of the exposure light, $\beta$ represents the magnitude of projection magnification (imaging magnification of the entire system), NA represents the image side (wafer side) numerical aperture, B represents the radius (maximum image height) of the image circle IF of the wafer W, A represents the off-axial distance of the effective exposure region ER, LX represents the X direction dimension (dimension of long side) of the effective exposure region ER, and LY represents the Y direction dimension (dimension of short side) of the effective exposure region ER. Furthermore, the plane number represents the order of planes from the reticle side along a path in which light travels from the reticle surface, which is the object plane (first plane), to the wafer surface, which is the image plane (second plane), r represent the curvature radius of each plane (for an aspheric surface, vertex curvature radius: mm), d represents the on-axial interval of each surface, or the plane interval (mm), and n represents the refractive index with respect to the central wavelength. The notations in table (1) are the same in following tables (2) to (4).

TABLE (1)

(Main Data)

$\lambda$ = 193.306 nm
$\beta$ = ¼
NA = 1.3
B = 15.3 mm
A = 3 mm
LX = 26 mm
LY = 5 mm (Optical Member Data)

| Surface No. | r | d | n | Optical member |
|---|---|---|---|---|
|  | (reticle surface) | 50.01731 |  |  |
| 1 | ∞ | 8.00000 | 1.5603261 | (P1) |
| 2 | ∞ | 3.00000 |  |  |
| 3 | 359.35331 | 26.76601 | 1.5603261 | (L11) |
| 4 | −592.06652 | 1.00943 |  |  |

TABLE (1)-continued

| | | | | |
|---|---|---|---|---|
| 5 | 188.50396 | 29.51291 | 1.5603261 | (L12) |
| 6 | 1262.96658 | 1.00995 | | |
| 7 | 131.49913 | 46.18333 | 1.5603261 | (L13) |
| 8 | 1954.91132 | 8.85417 | | |
| 9* | −10000.00000 | 25.05028 | 1.5603261 | (L14) |
| 10 | 231.29705 | 11.38727 | | |
| 11 | 492.35715 | 31.44530 | 1.5603261 | (L15) |
| 12 | −137.11439 | 2.50246 | | |
| 13 | −132.05403 | 12.00000 | 1.5603261 | (L16) |
| 14 | −154.20197 | 53.93758 | | |
| 15 | 251.52113 | 48.13618 | 1.5603261 | (L17) |
| 16 | −294.59191 | 2.34885 | | |
| 17* | −253.52720 | 36.61701 | 1.5603261 | (L18) |
| 18 | 227.51555 | 4.61148 | | |
| 19 | 263.71378 | 59.90928 | 1.5603261 | (L19) |
| 20 | −220.31099 | 1.00000 | | |
| 21* | 352.76853 | 12.04309 | 1.5603261 | (L110) |
| 22 | 406.90125 | 293.41742 | | |
| 23* | −222.16100 | −264.74504 | | (CM21) |
| 24* | 222.16100 | 289.74504 | | (CM22) |
| 25 | 250.00000 | 46.98417 | 1.5603261 | (L31) |
| 26* | 4002.72185 | 16.84088 | | |
| 27 | 265.30702 | 60.00000 | 1.5603261 | (L32) |
| 28* | 300.00030 | 29.78110 | | |
| 29 | 314.24516 | 12.00000 | 1.5603261 | (L33) |
| 30 | 101.47918 | 45.60947 | | |
| 31 | −667.76867 | 12.00000 | 1.5603261 | (L34) |
| 32* | 150.02400 | 75.84492 | | |
| 33* | −1480.01243 | 15.26159 | 1.5603261 | (L35) |
| 34 | −577.85202 | 3.58639 | | |
| 35 | 506.51841 | 59.02683 | 1.5603261 | (L36) |
| 36* | −217.24632 | 9.05593 | | |
| 37 | −217.83207 | 32.95317 | 1.5603261 | (L37) |
| 38* | 10000.00000 | 23.21220 | | |
| 39 | 1753.21795 | 90.45811 | 1.5603261 | (L38) |
| 40 | −233.97400 | 1.00000 | | |
| 41 | 852.72602 | 39.29703 | 1.5603261 | (L39) |
| 42 | −1372.88421 | 1.00000 | | |
| 43 | ∞ | 1.00000 | | (AS) |
| 44 | 304.44696 | 62.50392 | 1.5603261 | (L310) |
| 45 | ∞ | 1.00000 | | |
| 46 | 177.70008 | 65.77497 | 1.5603261 | (L311) |
| 47* | 727.92919 | 1.00000 | | |
| 48 | 106.72650 | 46.71807 | 1.5603261 | (L312) |
| 49* | 244.85259 | 1.00000 | | |
| 50 | 93.89038 | 49.33198 | 1.5603261 | (L313:Lb) |
| 51 | ∞ | 4.00000 | 1.435876 | (Lm) |
| (wafer surface) | | | | |

(Aspherical surface data)

Figure 5:
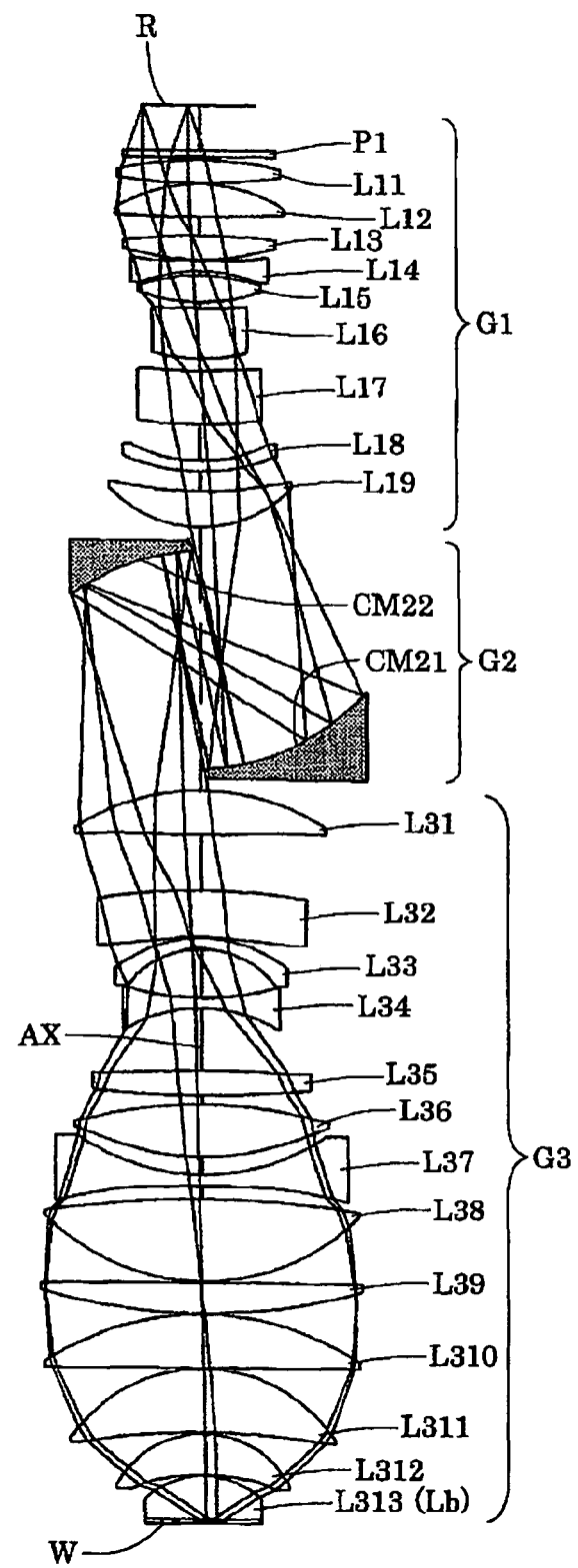
FIG. 5 is a diagram showing a lens structure of a projection optical system in a second example.

9th Surface:

$\kappa = 0$
$C_4 = -1.54796 \times 10^{-7}$    $C_6 = -9.02950 \times 10^{-12}$
$C_8 = 6.96112 \times 10^{-16}$    $C_{10} = 1.56338 \times 10^{-19}$
$C_{12} = -3.79854 \times 10^{-23}$    $C_{14} = 3.41001 \times 10^{-27}$
$C_{16} = -1.44360 \times 10^{-31}$ 17th Surface:

$\kappa = 0$
$C_4 = 8.20006 \times 10^{-8}$    $C_6 = -5.36780 \times 10^{-12}$
$C_8 = 3.97427 \times 10^{-16}$    $C_{10} = -3.82028 \times 10^{-20}$
$C_{12} = 2.62593 \times 10^{-24}$    $C_{14} = -1.11895 \times 10^{-28}$
$C_{16} = 2.33726 \times 10^{-33}$ 21st Surface:

$\kappa = 0$
$C_4 = -5.01452 \times 10^{-8}$    $C_6 = 4.51600 \times 10^{-13}$
$C_8 = -7.52486 \times 10^{-17}$    $C_{10} = 1.07231 \times 10^{-21}$
$C_{12} = -7.07040 \times 10^{-26}$    $C_{14} = -2.74751 \times 10^{-30}$
$C_{16} = 0$ 23rd Surface and 24th Surface: $\kappa = -4.61479 \times 10^{-1}$ $C_4 = 0$    $C_6 = 0$    $C_8 = 0$    $C_{10} = 0$    $C_{12} = 0$    $C_{14} = 0$    $C_{16} = 0$ 26th Surface:

$\kappa = 0$
$C_4 = 2.31679 \times 10^{-8}$    $C_6 = -1.49406 \times 10^{-12}$
$C_8 = 5.04761 \times 10^{-17}$    $C_{10} = -3.26396 \times 10^{-21}$ TABLE (1)-continued $C_{12} = 1.14830 \times 10^{-25}$    $C_{14} = -1.12557 \times 10^{-30}$
$C_{16} = 0$ 28th Surface:

$\kappa = 0$
$C_4 = -1.55615 \times 10^{-7}$    $C_6 = 7.43483 \times 10^{-12}$
$C_8 = -1.08787 \times 10^{-16}$    $C_{10} = 1.41061 \times 10^{-21}$
$C_{12} = -5.47257 \times 10^{-25}$    $C_{14} = 4.98826 \times 10^{-29}$
$C_{16} = -1.68053 \times 10^{-33}$ 32nd Surface:

$\kappa = 0$
$C_4 = 8.01855 \times 10^{-8}$    $C_6 = -4.66212 \times 10^{-12}$
$C_8 = -3.58078 \times 10^{-16}$    $C_{10} = 1.44294 \times 10^{-21}$
$C_{12} = 3.36335 \times 10^{-24}$    $C_{14} = -4.29851 \times 10^{-28}$
$C_{16} = 2.23460 \times 10^{-32}$ 33rd Surface:

$\kappa = 0$
$C_4 = 1.00217 \times 10^{-10}$    $C_6 = -9.46820 \times 10^{-13}$
$C_8 = -2.55450 \times 10^{-17}$    $C_{10} = 3.64850 \times 10^{-21}$
$C_{12} = -4.30983 \times 10^{-25}$    $C_{14} = 4.04408 \times 10^{-29}$
$C_{16} = -1.72430 \times 10^{-33}$ 36th Surface:

$\kappa = 0$
$C_4 = 2.30377 \times 10^{-8}$    $C_6 = -4.89128 \times 10^{-13}$
$C_8 = 6.31991 \times 10^{-17}$    $C_{10} = -1.10789 \times 10^{-21}$
$C_{12} = 1.26552 \times 10^{-27}$    $C_{14} = 4.56443 \times 10^{-30}$
$C_{16} = -1.76708 \times 10^{-34}$ 38th Surface:

$\kappa = 0$
$C_4 = 3.48769 \times 10^{-8}$    $C_6 = 2.67315 \times 10^{-13}$
$C_8 = -7.28249 \times 10^{-17}$    $C_{10} = 2.53956 \times 10^{-21}$
$C_{12} = -4.04906 \times 10^{-26}$    $C_{14} = 2.80450 \times 10^{-31}$
$C_{16} = -2.67181 \times 10^{-37}$ 47th Surface:

$\kappa = 0$
$C_4 = 5.03939 \times 10^{-9}$    $C_6 = -5.13382 \times 10^{-14}$
$C_8 = -2.86367 \times 10^{-17}$    $C_{10} = 3.07565 \times 10^{-21}$
$C_{12} = -1.33359 \times 10^{-25}$    $C_{14} = 2.88674 \times 10^{-30}$
$C_{16} = -2.54603 \times 10^{-35}$ 49th Surface:

$\kappa = 0$
$C_4 = 5.39853 \times 10^{-8}$    $C_6 = 6.72332 \times 10^{-12}$
$C_8 = -7.01770 \times 10^{-16}$    $C_{10} = 1.02255 \times 10^{-19}$
$C_{12} = -9.46223 \times 10^{-24}$    $C_{14} = 6.48610 \times 10^{-28}$
$C_{16} = -1.97332 \times 10^{-32}$ Second Example FIG. 5 is a diagram showing the lens structure of a projection optical system in a second example of the present embodiment. The projection optical system PL of the second example has a structure similar to the projection optical system of the first example but differs from the first example in that the first imaging system G1 includes a plane-parallel plate P1 and nine lenses L11 to L19. In the same manner as the first example, a variable aperture stop AS (not shown) for varying the numerical aperture of the projection optical system PL is arranged between the lenses L39 and L310 in the second example. Pure water (Lm) having a refractive index of 1.435876 with respect to the central wavelength ($\lambda$=193.306 nm) of the used light fills the optical path between the boundary lens Lb and the wafer W. All light transmissive members including the boundary lens Lb are made of silica having a refractive index of 1.5603261 with respect to the central wavelength of the user light. In table (2), values for the data of the projection optical system PL in the second example are shown.

TABLE (2)

(Main Data)

$\lambda = 193.306$ nm
$\beta = \frac{1}{4}$
NA = 1.3
B = 15.3 mm
A = 3 mm
LX = 26 mm
LY = 5 mm (Optical Member Data)

| Surface No. | r | d | n | Optical member |
|---|---|---|---|---|
|  | (reticle surface) | 50.00000 |  |  |
| 1 | ∞ | 8.00000 | 1.5603261 | (P1) |
| 2 | ∞ | 3.00000 |  |  |
| 3 | 350.00000 | 26.28641 | 1.5603261 | (L11) |
| 4 | -665.94436 | 1.00000 |  |  |
| 5 | 172.74138 | 36.82423 | 1.5603261 | (L12) |
| 6 | -2430.40224 | 20.92756 |  |  |
| 7 | 667.12691 | 27.18371 | 1.5603261 | (L13) |
| 8 | -261.03913 | 1.00000 |  |  |
| 9* | -10000.00000 | 12.00000 | 1.5603261 | (L14) |
| 10 | 170.08164 | 4.71404 |  |  |
| 11 | 209.73456 | 30.45718 | 1.5603261 | (L15) |
| 12 | -194.43972 | 6.83284 |  |  |
| 13 | -894.93083 | 57.27301 | 1.5603261 | (L16) |
| 14 | -205.97283 | 13.81931 |  |  |
| 15 | -618.49866 | 60.00000 | 1.5603261 | (L17) |
| 16 | -464.22016 | 40.63089 |  |  |
| 17* | -180.28348 | 12.00000 | 1.5603261 | (L18) |
| 18 | -211.91956 | 23.32717 |  |  |
| 19 | -393.40980 | 40.85830 | 1.5603261 | (L19) |
| 20 | -134.62823 | 274.86174 |  |  |
| 21* | -212.33226 | -246.86174 |  | (CM21) |
| 22* | 212.33226 | 271.86174 |  | (CM22) |
| 23 | 250.00000 | 50.00409 | 1.5603261 | (L31) |
| 24* | -1455.71002 | 63.71331 |  |  |
| 25 | 720.36425 | 53.04919 | 1.5603261 | (L32) |
| 26* | 300.00000 | 1.00000 |  |  |
| 27 | 147.14257 | 12.00000 | 1.5603261 | (L33) |
| 28 | 99.27543 | 56.32887 |  |  |
| 29 | -301.56250 | 12.00000 | 1.5603261 | (L34) |
| 30* | 167.61368 | 70.32537 |  |  |
| 31* | 1037.83963 | 28.10521 | 1.5603261 | (L35) |
| 32 | -1013.91442 | 10.41970 |  |  |
| 33 | 518.14725 | 60.00000 | 1.5603261 | (L36) |
| 34* | -245.97754 | 19.81238 |  |  |
| 35 | -231.71392 | 12.71220 | 1.5603261 | (L37) |
| 36* | 10000.00000 | 14.42919 |  |  |
| 37 | 1115.84371 | 91.94920 | 1.5603261 | (L38) |
| 38 | -240.84805 | 1.00000 |  |  |
| 39 | 32668.42319 | 34.47637 | 1.5603261 | (L39) |
| 40 | -635.81012 | 1.00000 |  |  |
| 41 | ∞ | 1.00000 |  | (AS) |
| 42 | 316.97951 | 58.76507 | 1.5603261 | (L310) |
| 43 | ∞ | 1.00000 |  |  |
| 44 | 174.97524 | 70.86702 | 1.5603261 | (L311) |
| 45* | 909.37199 | 1.00000 |  |  |
| 46 | 107.07381 | 46.08774 | 1.5603261 | (L312) |
| 47* | 256.65177 | 1.00000 |  |  |
| 48 | 93.23210 | 47.95872 | 1.5603261 | (L313:Lb) |
| 49 | ∞ | 4.00000 | 1.435876 | (Lm) |
|  | (wafer surface) |  |  |  |

(Aspherical surface data)

Figure 6:
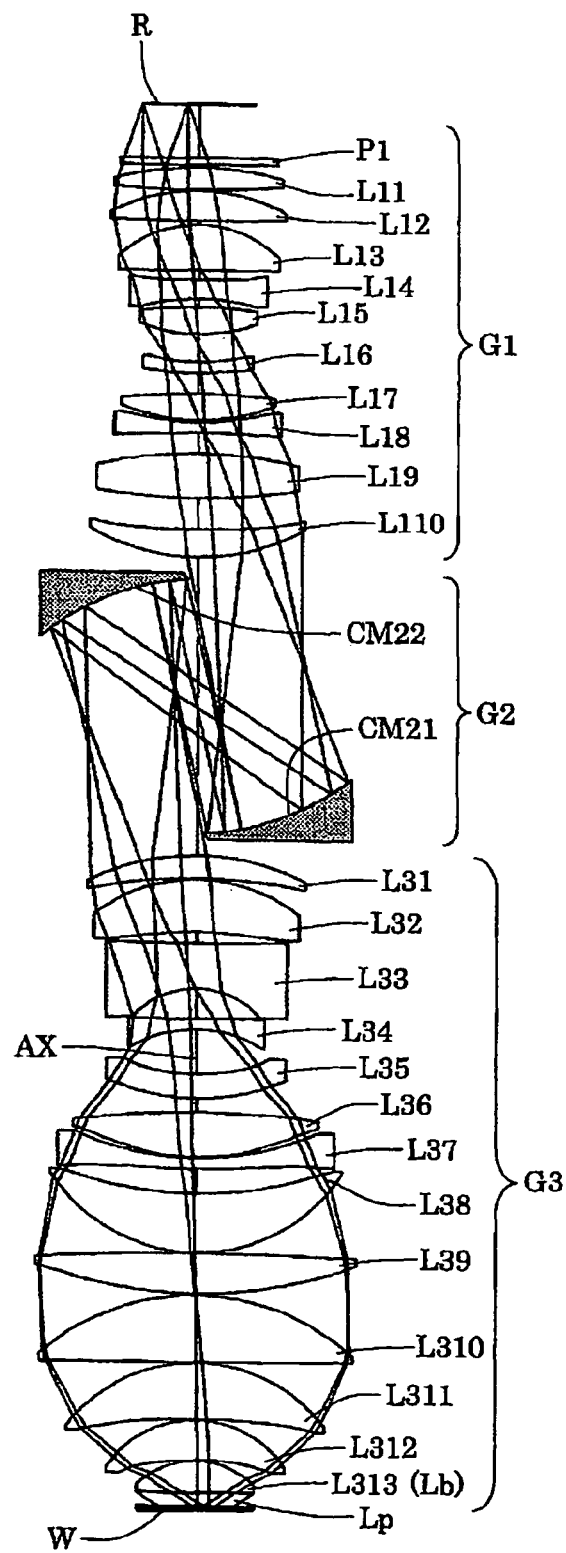
FIG. 6 is a diagram showing a lens structure of a projection optical system in a third example.

9th Surface:

$\kappa = 0$
$C_4 = -7.94163 \times 10^{-8}$    $C_6 = -1.12048 \times 10^{-11}$
$C_8 = 9.46158 \times 10^{-16}$    $C_{10} = -3.46518 \times 10^{-20}$
$C_{12} = 4.48980 \times 10^{-24}$    $C_{14} = -1.25126 \times 10^{-27}$
$C_{16} = 1.06865 \times 10^{-31}$ 17th Surface:

$\kappa = 0$
$C_4 = -5.07692 \times 10^{-8}$    $C_6 = -2.75751 \times 10^{-12}$ TABLE (2)-continued $C_8 = -1.96475 \times 10^{-16}$    $C_{10} = -7.15077 \times 10^{-21}$
$C_{12} = -3.22240 \times 10^{-24}$   $C_{14} = 3.95636 \times 10^{-28}$
$C_{16} = -4.50731 \times 10^{-32}$
21st Surface and 22nd Surface: $\kappa = -5.22296 \times 10^{-1}$ $C_4 = 0$  $C_6 = 0$  $C_8 = 0$  $C_{10} = 0$  $C_{12} = 0$  $C_{14} = 0$  $C_{16} = 0$
24th Surface:

$\kappa = 0$
$C_4 = 2.07397 \times 10^{-8}$    $C_6 = -3.79394 \times 10^{-13}$
$C_8 = 1.57647 \times 10^{-17}$   $C_{10} = -4.68999 \times 10^{-22}$
$C_{12} = 7.80825 \times 10^{-27}$  $C_{14} = 1.93892 \times 10^{-32}$
$C_{16} = 0$
26th Surface:

$\kappa = 0$
$C_4 = -1.21103 \times 10^{-7}$   $C_6 = 4.11617 \times 10^{-12}$
$C_8 = 5.23983 \times 10^{-17}$   $C_{10} = -9.49443 \times 10^{-21}$
$C_{12} = 3.16472 \times 10^{-25}$  $C_{14} = -5.66632 \times 10^{-30}$
$C_{16} = 2.24225 \times 10^{-34}$
30th Surface:

$\kappa = 0$
$C_4 = 6.87953 \times 10^{-8}$    $C_6 = -6.93885 \times 10^{-12}$
$C_8 = 1.27248 \times 10^{-16}$   $C_{10} = 9.92890 \times 10^{-21}$
$C_{12} = -1.57846 \times 10^{-24}$ $C_{14} = 1.20747 \times 10^{-28}$
$C_{16} = -4.60400 \times 10^{-33}$
31st Surface:

$\kappa = 0$
$C_4 = -7.92258 \times 10^{-9}$   $C_6 = -8.45323 \times 10^{-13}$
$C_8 = -6.30202 \times 10^{-18}$  $C_{10} = 1.82975 \times 10^{-21}$
$C_{12} = -2.40696 \times 10^{-25}$ $C_{14} = 1.72188 \times 10^{-29}$
$C_{16} = -6.30974 \times 10^{-34}$
34th Surface:

$\kappa = 0$
$C_4 = 1.91366 \times 10^{-8}$    $C_6 = -4.08222 \times 10^{-13}$
$C_8 = 4.47244 \times 10^{-17}$   $C_{10} = -1.28611 \times 10^{-21}$
$C_{12} = 1.95615 \times 10^{-26}$  $C_{14} = 1.47882 \times 10^{-30}$
$C_{16} = -5.15398 \times 10^{-35}$
36th Surface:

$\kappa = 0$
$C_4 = 3.65791 \times 10^{-8}$    $C_6 = 2.42487 \times 10^{-13}$
$C_8 = -7.11218 \times 10^{-17}$  $C_{10} = 2.50257 \times 10^{-21}$
$C_{12} = -4.19556 \times 10^{-26}$ $C_{14} = 3.45349 \times 10^{-31}$
$C_{16} = -1.00445 \times 10^{-36}$
45th Surface:

$\kappa = 0$
$C_4 = 5.81397 \times 10^{-9}$    $C_6 = -1.14961 \times 10^{-13}$
$C_8 = -2.72099 \times 10^{-17}$  $C_{10} = 3.15197 \times 10^{-21}$
$C_{12} = -1.41272 \times 10^{-25}$ $C_{14} = 3.13451 \times 10^{-30}$
$C_{16} = -2.85206 \times 10^{-35}$
47th Surface:

$\kappa = 0$
$C_4 = 5.76732 \times 10^{-8}$    $C_6 = 5.86230 \times 10^{-12}$
$C_8 = -4.67768 \times 10^{-16}$  $C_{10} = 6.56861 \times 10^{-20}$
$C_{12} = -4.93777 \times 10^{-24}$ $C_{14} = 3.36794 \times 10^{-28}$
$C_{16} = -8.08755 \times 10^{-33}$ Third Example FIG. 6 is a diagram showing the lens structure of a projection optical system in a third example of the present embodiment. The projection optical system PL of the third example has a structure similar to the projection optical system of the first example but differs from the first example in that a plane-parallel plate Lp is additionally arranged on the image side of the lens L313 (boundary lens Lb) of the third imaging system G3. In the same manner as the first example, a variable aperture stop AS (not shown) for varying the numerical aperture of the projection optical system PL is arranged between the lenses L39 and L310 in the third example. Pure water (Lm) having a refractive index of 1.435876 with respect to the central wavelength ($\lambda=193.306$ nm) of the used light fills the optical path between the boundary lens Lb and the plane-parallel plate Lp and between the plane-parallel plate Lp and the wafer W. All light transmissive members including the boundary lens Lb and the plane-parallel plate Lp are made of silica having a refractive index of 1.5603261 with respect to the central wavelength of the used light. In table (3), values of the data of the projection optical system PL in the third example are shown.

TABLE (3)

(Main Data)

$\lambda = 193.306$ nm
$\beta = \frac{1}{4}$
NA = 1.3
B = 15.3 mm
A = 3 mm
LX = 26 mm
LY = 5 mm (Optical Member Data)

| Surface No. | r | d | n | Optical member |
|---|---|---|---|---|
|  | (reticle surface) | 60.59272 |  |  |
| 1 | ∞ | 8.00000 | 1.5603261 | (P1) |
| 2 | ∞ | 3.00000 |  |  |
| 3 | 350.00000 | 25.01025 | 1.5603261 | (L11) |
| 4 | −1224.92925 | 1.00000 |  |  |
| 5 | 206.91963 | 33.55065 | 1.5603261 | (L12) |
| 6 | −4382.64940 | 4.05890 |  |  |
| 7 | 128.14708 | 51.26364 | 1.5603261 | (L13) |
| 8 | −19008.21291 | 10.73486 |  |  |
| 9* | −10000.00000 | 21.70324 | 1.5603261 | (L14) |
| 10 | 227.01998 | 9.85859 |  |  |
| 11 | 536.14092 | 30.62633 | 1.5603261 | (L15) |
| 12 | −180.47868 | 31.92390 |  |  |
| 13 | −194.75157 | 12.48850 | 1.5603261 | (L16) |
| 14 | −348.78982 | 23.42406 |  |  |
| 15 | 677.92639 | 30.00994 | 1.5603261 | (L17) |
| 16 | −228.61290 | 2.77178 |  |  |
| 17* | −217.84784 | 12.00000 | 1.5603261 | (L18) |
| 18 | 1368.50810 | 23.24653 |  |  |
| 19 | 477.30552 | 52.43548 | 1.5603261 | (L19) |
| 20 | −650.67254 | 36.29231 |  |  |
| 21* | −1450.59982 | 32.45657 | 1.5603261 | (L110) |
| 22 | −229.46989 | 316.04538 |  |  |
| 23* | −244.76209 | −291.04538 |  | (CM21) |
| 24* | 244.76209 | 316.04538 |  | (CM22) |
| 25 | 256.69408 | 26.83267 | 1.5603261 | (L31) |
| 26* | 659.71329 | 1.00000 |  |  |
| 27 | 180.00000 | 60.00000 | 1.5603261 | (L32) |
| 28* | 323.45083 | 13.25837 |  |  |
| 29 | −3123.59117 | 52.76868 | 1.5603261 | (L33) |
| 30 | 91.75540 | 34.45029 |  |  |
| 31 | −13079.55268 | 12.00000 | 1.5603261 | (L34) |
| 32* | 149.99993 | 49.88931 |  |  |
| 33* | −232.46732 | 27.31503 | 1.5603261 | (L35) |
| 34 | −245.25302 | 15.97419 |  |  |
| 35 | 945.81643 | 52.25099 | 1.5603261 | (L36) |
| 36* | −242.46539 | 1.00000 |  |  |
| 37 | −318.15388 | 12.60438 | 1.5603261 | (L37) |
| 38* | −749.94000 | 28.40839 |  |  |
| 39* | −484.21460 | 68.04993 | 1.5603261 | (L38) |
| 40 | −187.43622 | 1.00000 |  |  |
| 41 | 3334.64266 | 45.38994 | 1.5603261 | (L39) |
| 42 | −495.28343 | 1.00000 |  |  |
| 43 | ∞ | 1.00000 |  | (AS) |
| 46 | 263.22062 | 73.28068 | 1.5603261 | (L310) |
| 45 | ∞ | 1.00000 |  |  |
| 46 | 179.80617 | 62.56473 | 1.5603261 | (L311) |
| 47* | 903.57091 | 1.00000 |  |  |
| 48 | 116.76198 | 45.74003 | 1.5603261 | (L312) |
| 49* | 332.92051 | 1.00000 |  |  |
| 50 | 90.79661 | 34.72878 | 1.5603261 | (L313:Lb) |

TABLE (3)-continued

| 51 | ∞ | 1.00000 | 1.435876 | (Lm) |
| 52 | ∞ | 15.00000 | 1.5603261 | (Lp) |
| 53 | ∞ | 3.00001 | 1.435876 | (Lm) |
| (wafer surface) | | | | |

(Aspherical surface data)

Figure 7:
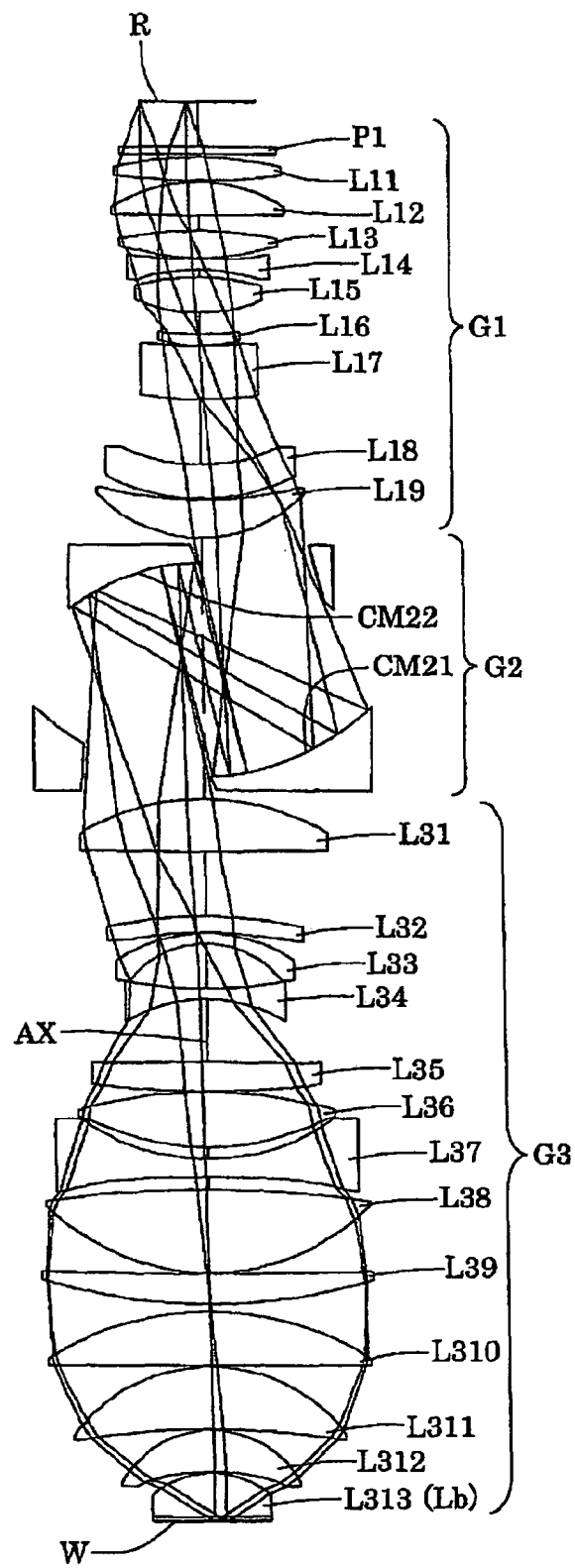
FIG. 7 is a diagram showing a lens structure of a projection optical system in a fourth example.

9th Surface:

$\kappa = 0$
$C_4 = -6.36223 \times 10^{-8}$    $C_6 = -2.78658 \times 10^{-11}$
$C_8 = 3.89619 \times 10^{-15}$    $C_{10} = -2.25803 \times 10^{-19}$
$C_{12} = 2.81471 \times 10^{-24}$    $C_{14} = 4.21124 \times 10^{-28}$
$C_{16} = -2.05357 \times 10^{-32}$ 17th Surface:

$\kappa = 0$
$C_4 = 1.17285 \times 10^{-7}$    $C_6 = -7.91844 \times 10^{-13}$
$C_8 = -3.72009 \times 10^{-17}$    $C_{10} = -5.83288 \times 10^{-21}$
$C_{12} = 8.73301 \times 10^{-25}$    $C_{14} = -4.24135 \times 10^{-29}$
$C_{16} = 7.44152 \times 10^{-34}$ 21st Surface:

$\kappa = 0$
$C_4 = -2.79633 \times 10^{-8}$    $C_6 = -6.40147 \times 10^{-14}$
$C_8 = -1.77090 \times 10^{-17}$    $C_{10} = -7.70384 \times 10^{-23}$
$C_{12} = 6.05413 \times 10^{-28}$    $C_{14} = -4.82364 \times 10^{-31}$
$C_{16} = 0$ 23rd Surface and 24th Surface: $\kappa = -4.68769 \times 10^{-1}$ $C_4 = 0$    $C_6 = 0$    $C_8 = 0$    $C_{10} = 0$    $C_{12} = 0$    $C_{14} = 0$    $C_{16} = 0$ 26th Surface:

$\kappa = 0$
$C_4 = 1.28304 \times 10^{-8}$    $C_6 = -6.38513 \times 10^{-13}$
$C_8 = 2.18379 \times 10^{-17}$    $C_{10} = -7.21301 \times 10^{-22}$
$C_{12} = 1.60083 \times 10^{-26}$    $C_{14} = 6.67071 \times 10^{-31}$
$C_{16} = 0$ 28th Surface:

$\kappa = 0$
$C_4 = -8.61082 \times 10^{-8}$    $C_6 = 3.70311 \times 10^{-12}$
$C_8 = -1.15755 \times 10^{-16}$    $C_{10} = -1.47959 \times 10^{-21}$
$C_{12} = 2.24158 \times 10^{-25}$    $C_{14} = -2.68433 \times 10^{-29}$
$C_{16} = 9.21791 \times 10^{-34}$ 32nd Surface:

$\kappa = 0$
$C_4 = 1.17328 \times 10^{-7}$    $C_6 = -7.98161 \times 10^{-12}$
$C_8 = -8.88398 \times 10^{-16}$    $C_{10} = 6.34394 \times 10^{-20}$
$C_{12} = -7.03704 \times 10^{-25}$    $C_{14} = 1.11280 \times 10^{-28}$
$C_{16} = -5.69039 \times 10^{-32}$ 33rd Surface:

$\kappa = 0$
$C_4 = -3.26290 \times 10^{-8}$    $C_6 = -2.46812 \times 10^{-12}$
$C_8 = -2.76561 \times 10^{-16}$    $C_{10} = -9.26317 \times 10^{-21}$
$C_{12} = 1.88212 \times 10^{-25}$    $C_{14} = -1.67486 \times 10^{-28}$
$C_{16} = 2.14395 \times 10^{-33}$ 36th Surface:

$\kappa = 0$
$C_4 = -2.70469 \times 10^{-9}$    $C_6 = 3.90106 \times 10^{-13}$
$C_8 = 8.25231 \times 10^{-17}$    $C_{10} = -2.50778 \times 10^{-21}$
$C_{12} = 3.15344 \times 10^{-26}$    $C_{14} = 1.47976 \times 10^{-30}$
$C_{16} = -4.53768 \times 10^{-35}$ 38th Surface:

$\kappa = 0$
$C_4 = 3.85119 \times 10^{-8}$    $C_6 = 6.53162 \times 10^{-14}$
$C_8 = -8.58613 \times 10^{-17}$    $C_{10} = 3.11815 \times 10^{-21}$
$C_{12} = -3.24648 \times 10^{-27}$    $C_{14} = -1.78776 \times 10^{-30}$
$C_{16} = 3.61731 \times 10^{-35}$ 39th Surface:

$\kappa = 0$
$C_4 = -2.07070 \times 10^{-8}$    $C_6 = 7.79234 \times 10^{-13}$
$C_8 = -1.10680 \times 10^{-17}$    $C_{10} = -2.94753 \times 10^{-23}$
$C_{12} = 1.12845 \times 10^{-26}$    $C_{14} = -2.12927 \times 10^{-31}$
$C_{16} = 1.76565 \times 10^{-35}$ 47th Surface:

$\kappa = 0$
$C_4 = 1.61169 \times 10^{-8}$    $C_6 = -1.18321 \times 10^{-13}$
$C_8 = -3.24899 \times 10^{-17}$    $C_{10} = 3.02257 \times 10^{-21}$
$C_{12} = -1.03794 \times 10^{-25}$    $C_{14} = 1.63372 \times 10^{-30}$
$C_{16} = -6.02947 \times 10^{-36}$ 49th Surface:

$\kappa = 0$
$C_4 = 4.74997 \times 10^{-8}$    $C_6 = 5.30520 \times 10^{-12}$
$C_8 = -5.83896 \times 10^{-16}$    $C_{10} = 6.78393 \times 10^{-20}$
$C_{12} = -5.78534 \times 10^{-24}$    $C_{14} = 3.15579 \times 10^{-28}$
$C_{16} = -9.54421 \times 10^{-33}$ Fourth Example FIG. 7 is a diagram showing the lens structure of a projection optical system in a fourth example of the present embodiment. The projection optical system PL of the fourth example has a structure that is similar to the projection optical system of the second example but differs from the second example in that the first concave reflection mirror CM21 and the second concave reflection mirror CM22 have different prolate spheroidal-shaped reflection surfaces. In the same manner as the first to third examples, a variable aperture stop AS (not shown) for varying the numerical aperture of the projection optical system PL is arranged between the lens L39 and L310 in the fourth example. Pure water (Lm) having a refractive index of 1.435876 with respect to the central wavelength ($\lambda=193.306$ nm) of the used light fills the optical path between the boundary lens Lb and the wafer W. All light transmissive members including the boundary lens Lb are made of silica having a refractive index of 1.5603261 with respect to the central wavelength of the used light. In table (4), values of the data of the projection optical system PL in the fourth example are shown.

TABLE (4)

(Main Data)

$\lambda = 193.306$ nm
$\beta = \frac{1}{4}$
NA = 1.3
B = 15.5 mm
A = 3 mm
LX = 26 mm
LY = 5.4 mm (Optical Member Data)

| Surface No. | r | d | n | Optical member |
|---|---|---|---|---|
| | (reticle surface) | 50.00000 | | |
| 1 | ∞ | 8.00000 | 1.5603261 | (P1) |
| 2 | ∞ | 3.00000 | | |
| 3 | 350.00000 | 26.46669 | 1.5603261 | (L11) |
| 4 | −645.53379 | 1.00000 | | |
| 5 | 173.21612 | 35.96742 | 1.5603261 | (L12) |
| 6 | −4461.33635 | 17.43708 | | |
| 7 | 429.14439 | 29.48354 | 1.5603261 | (L13) |
| 8 | −275.94579 | 1.00000 | | |
| 9* | −10000.00000 | 12.00000 | 1.5603261 | (L14) |
| 10 | 196.20422 | 8.94774 | | |
| 11 | 258.27992 | 39.92164 | 1.5603261 | (L15) |
| 12 | −164.97583 | 24.02524 | | |
| 13 | −329.36372 | 13.24024 | 1.5603261 | (L16) |
| 14 | −162.64110 | 1.00000 | | |
| 15 | −326.01876 | 60.00000 | 1.5603261 | (L17) |
| 16 | −427.96564 | 74.27880 | | |

TABLE (4)-continued

| | | | | |
|---|---|---|---|---|
| 17* | −217.83502 | 39.00740 | 1.5603261 | (L18) |
| 18 | −209.99644 | 1.00000 | | |
| 19 | −415.60502 | 43.09094 | 1.5603261 | (L19) |
| 20 | −149.08140 | 272.96919 | | |
| 21* | −218.14866 | −244.96924 | | (CM21) |
| 22* | 206.74356 | 269.96924 | | (CM22) |
| 23 | 250.00000 | 60.00000 | 1.5603261 | (L31) |
| 24* | −1807.69717 | 72.81359 | | |
| 25 | 515.58231 | 17.77536 | 1.5603261 | (L32) |
| 26* | 300.00000 | 1.00000 | | |
| 27 | 163.58924 | 12.00000 | 1.5603261 | (L33) |
| 28 | 101.14446 | 51.52417 | | |
| 29 | −394.42597 | 12.00000 | 1.5603261 | (L34) |
| 30* | 167.48287 | 71.79218 | | |
| 31* | 1770.69500 | 33.44958 | 1.5603261 | (L35) |
| 32 | −944.57367 | 1.00000 | | |
| 33 | 490.43911 | 62.46956 | 1.5603261 | (L36) |
| 34* | −240.54652 | 13.42458 | | |
| 35 | −222.80174 | 20.72182 | 1.5603261 | (L37) |
| 36* | 10000.00000 | 14.05071 | | |
| 37 | 1139.46045 | 92.84277 | 1.5603261 | (L38) |
| 38 | −240.80811 | 1.00000 | | |
| 39 | −5618.39788 | 33.50378 | 1.5603261 | (L39) |
| 40 | −593.54446 | 8.09015 | | |
| 41 | ∞ | 0.00000 | | (AS) |
| 42 | 315.55302 | 59.64796 | 1.5603261 | (L310) |
| 43 | ∞ | 1.00000 | | |
| 44 | 176.29938 | 71.37651 | 1.5603261 | (L311) |
| 45* | 896.05735 | 1.00000 | | |
| 46 | 108.27570 | 46.41051 | 1.5603261 | (L312) |
| 47* | 263.95601 | 1.00000 | | |
| 48 | 93.45630 | 49.27084 | 1.5603261 | (L313:Lb) |
| 49 | ∞ | 4.00000 | 1.435876 | (Lm) |
| (wafer surface) | | | | |

(Aspherical surface data)

Figure 8:
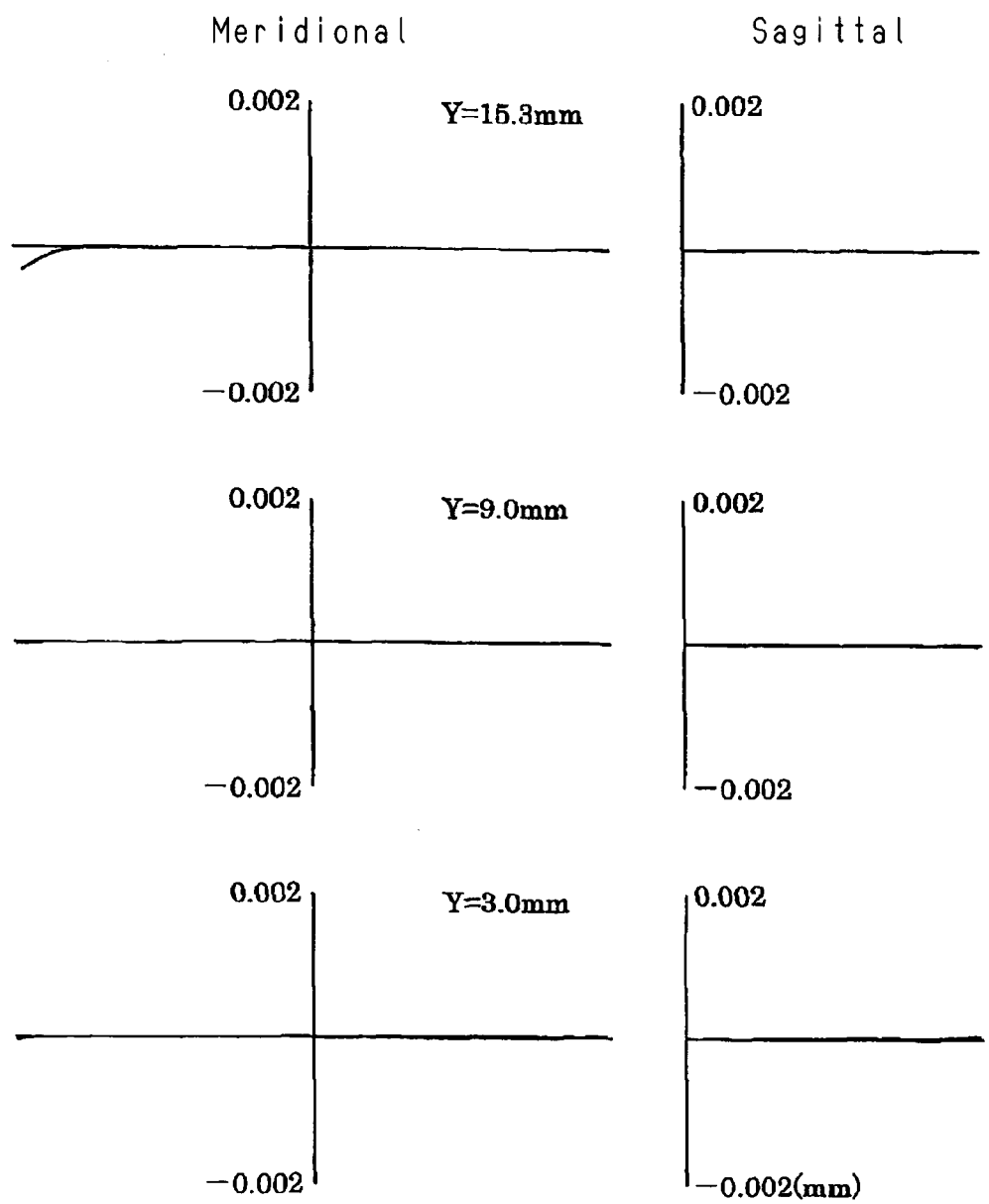
FIG. 8 is a diagram showing lateral aberration in the projection optical system of the first example.
Figure 9:
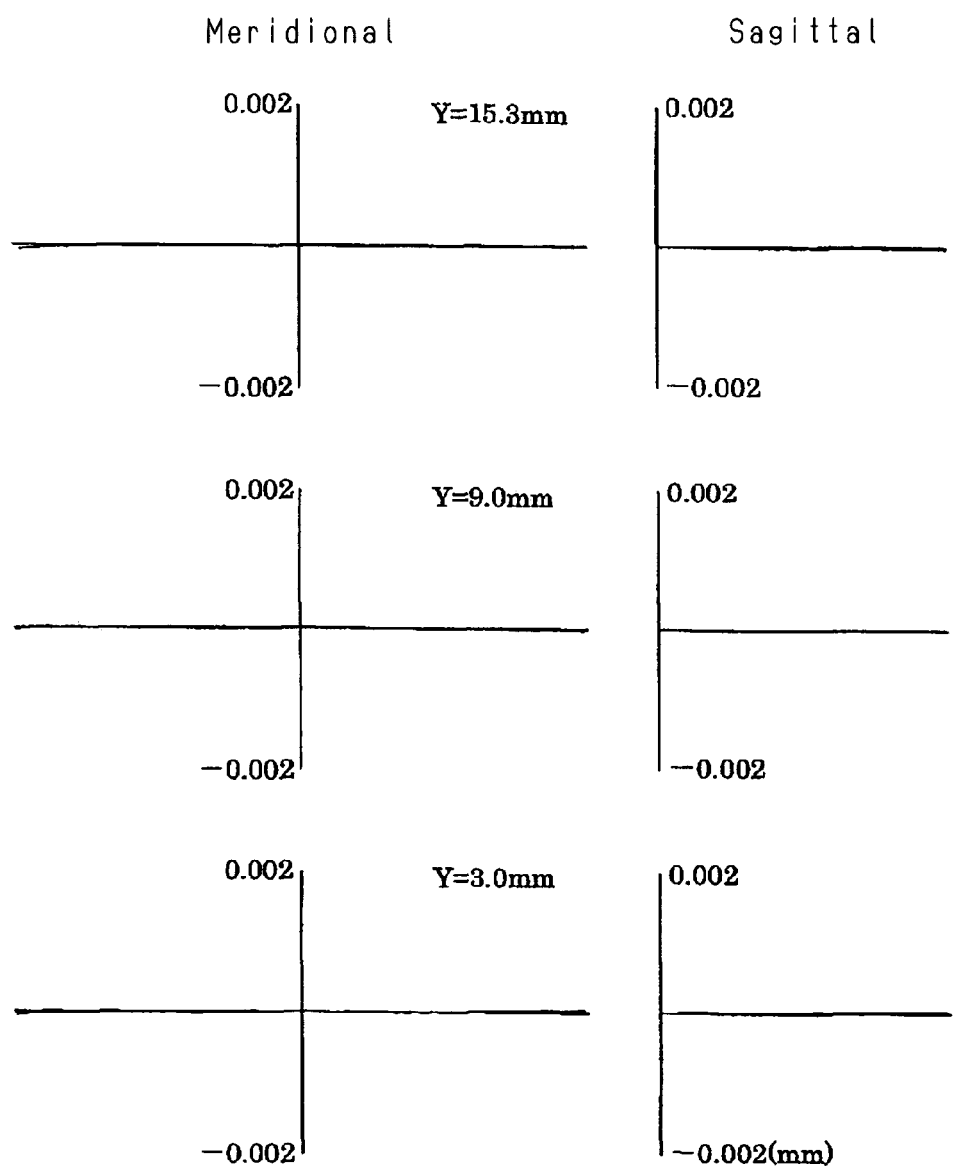
FIG. 9 is a diagram showing lateral aberration in the projection optical system of the second example.
Figure 10:
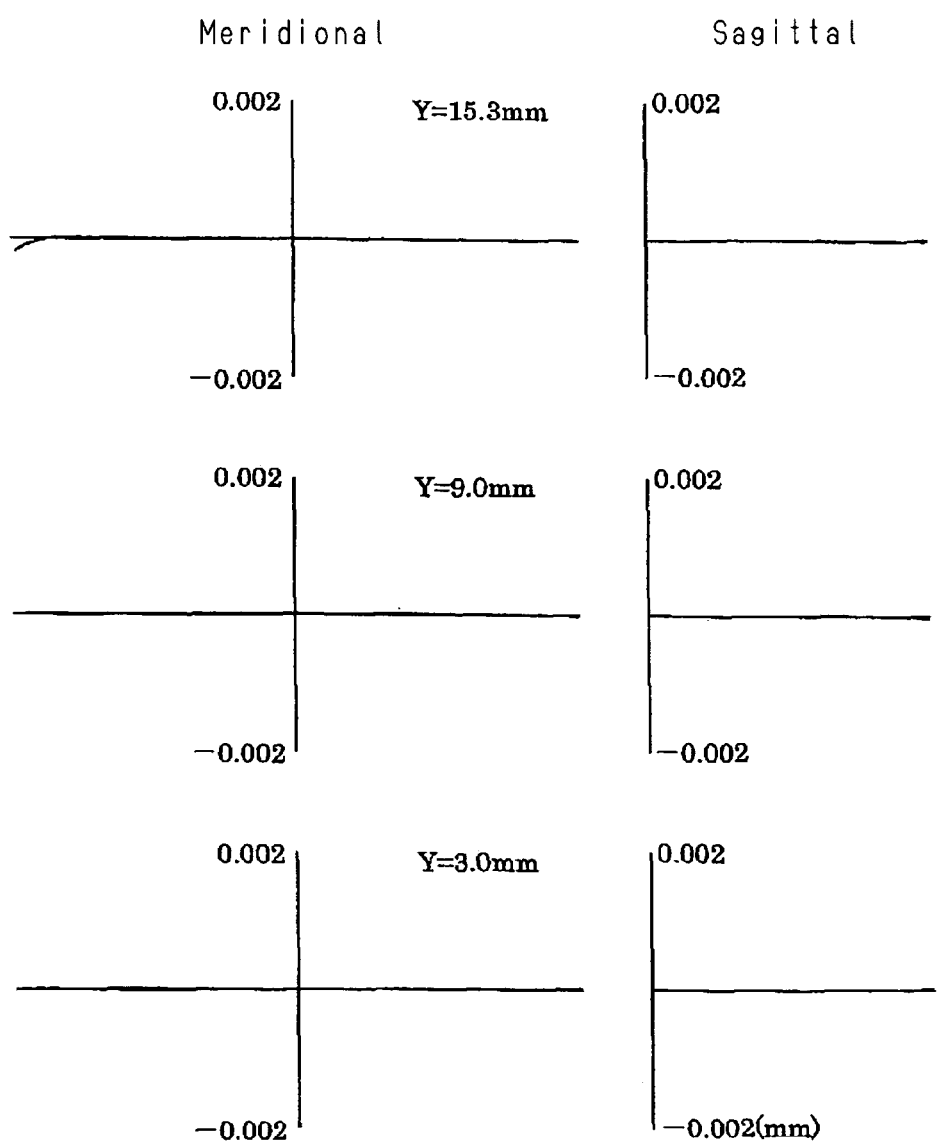
FIG. 10 is a diagram showing lateral aberration in the projection optical system of the third example.
Figure 11:
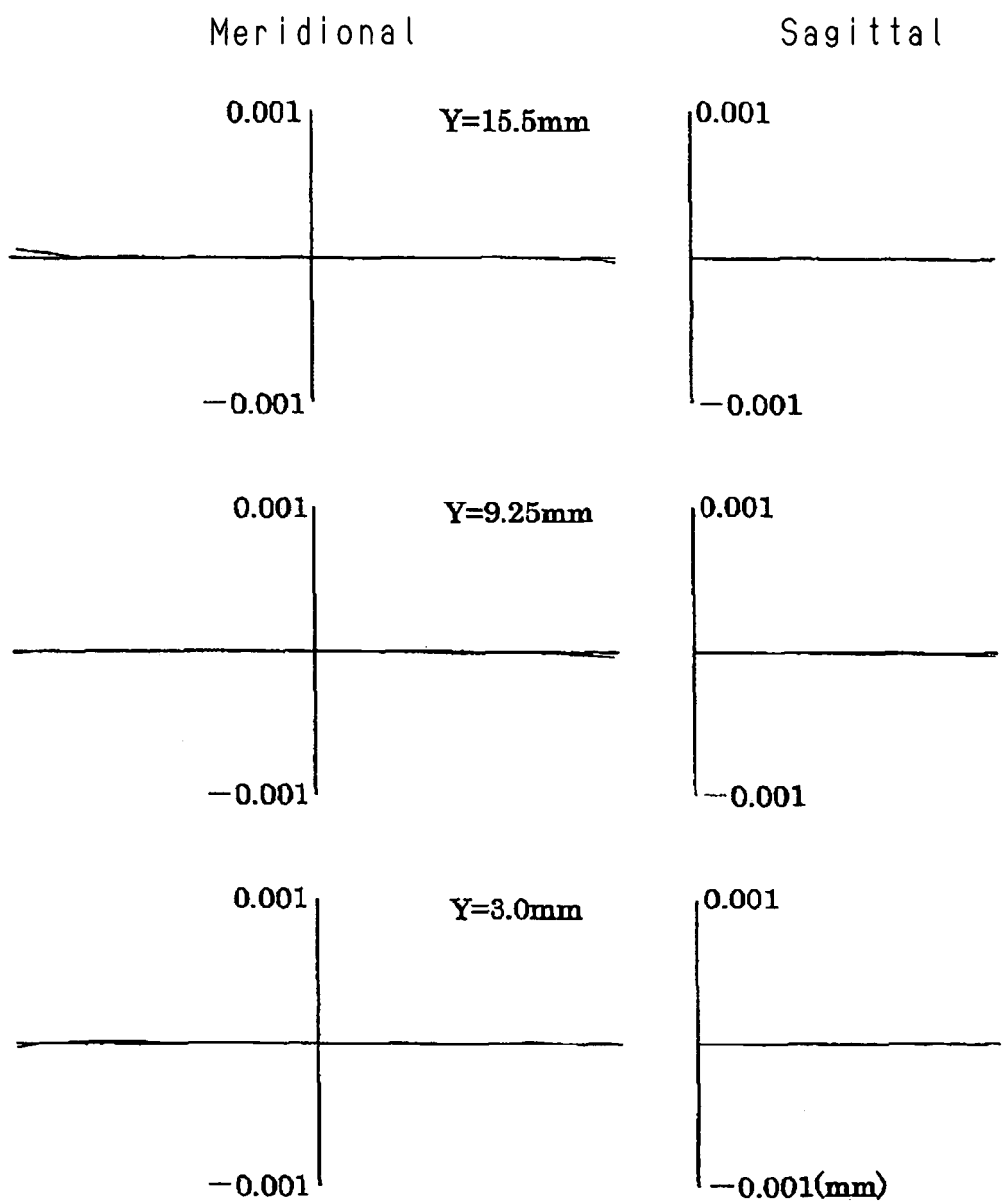
FIG. 11 is a diagram showing lateral aberration in the projection optical system of the fourth example.
Figure 12:
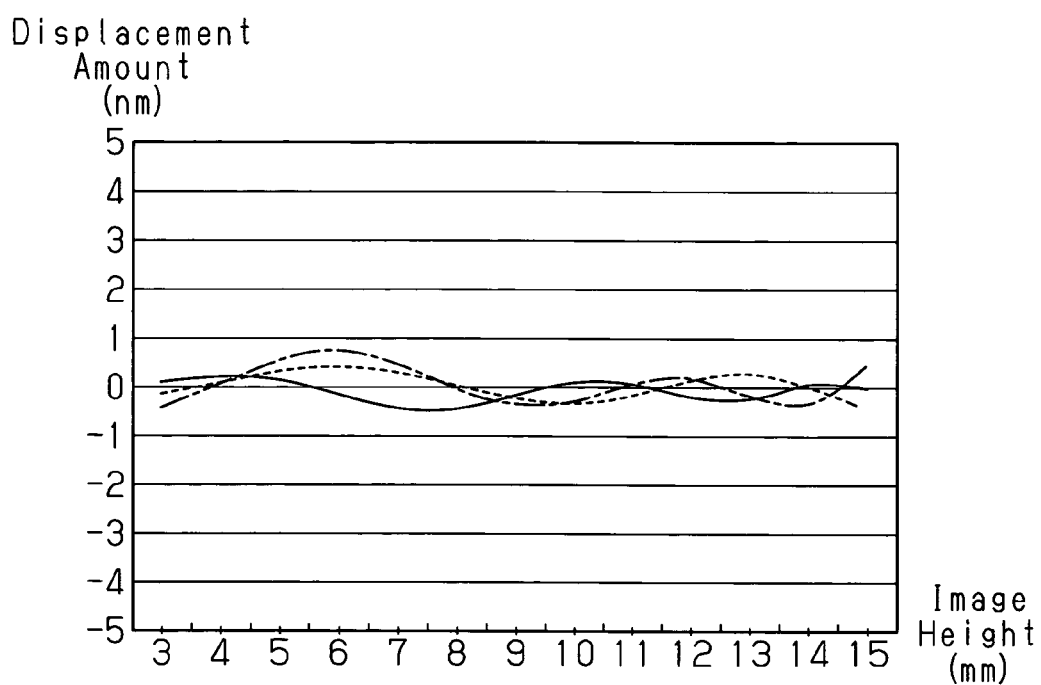
FIG. 12 is a diagram showing distortion in each example.
Figure 13:
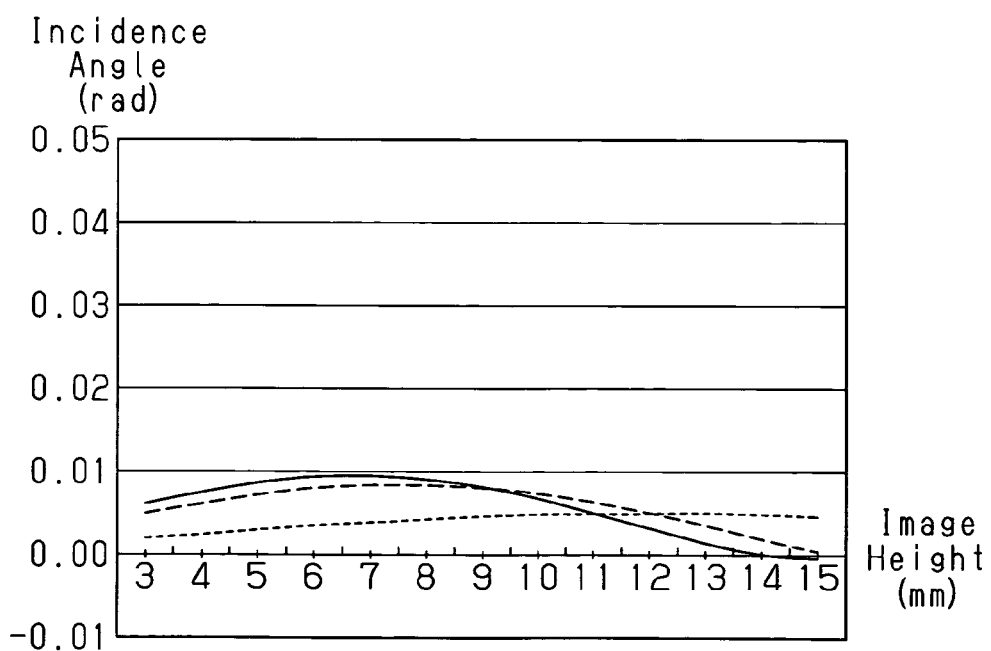
FIG. 13 is a diagram showing the telecentricity error in each example.

9th Surface:

$\kappa = 0$
$C_4 = -1.01587 \times 10^{-7}$ $C_6 = -1.09403 \times 10^{-11}$
$C_8 = 5.75764 \times 10^{-16}$ $C_{10} = 8.43343 \times 10^{-23}$
$C_{12} = 2.40575 \times 10^{-24}$ $C_{14} = -1.14543 \times 10^{-27}$
$C_{16} = 8.25026 \times 10^{-32}$ 17th Surface:

$\kappa = 0$
$C_4 = -4.59637 \times 10^{-8}$ $C_6 = -1.72557 \times 10^{-12}$
$C_8 = -1.10492 \times 10^{-16}$ $C_{10} = 3.92199 \times 10^{-22}$
$C_{12} = -1.76553 \times 10^{-24}$ $C_{14} = 1.79310 \times 10^{-28}$
$C_{16} = -1.29106 \times 10^{-32}$ 21st Surface: $\kappa = -0.631982$ $C_4 = 0$ $C_6 = 0$ $C_8 = 0$ $C_{10} = 0$ $C_{12} = 0$ $C_{14} = 0$ $C_{16} = 0$ 22nd Surface: $\kappa = -0.461982$ $C_4 = 0$ $C_6 = 0$ $C_8 = 0$ $C_{10} = 0$ $C_{12} = 0$ $C_{14} = 0$ $C_{16} = 0$ 24th Surface:

$\kappa = 0$
$C_4 = 1.84630 \times 10^{-8}$ $C_6 = -6.13960 \times 10^{-13}$
$C_8 = 2.05342 \times 10^{-17}$ $C_{10} = -1.07721 \times 10^{-21}$
$C_{12} = 2.17679 \times 10^{-26}$ $C_{14} = 1.73335 \times 10^{-31}$
$C_{16} = 0$ 26th Surface:

$\kappa = 0$
$C_4 = -1.27015 \times 10^{-7}$ $C_6 = 5.82566 \times 10^{-12}$
$C_8 = 1.75629 \times 10^{-17}$ $C_{10} = -8.60445 \times 10^{-21}$
$C_{12} = 1.08176 \times 10^{-25}$ $C_{14} = 3.03109 \times 10^{-29}$
$C_{16} = -1.92607 \times 10^{-33}$ 30th Surface:

$\kappa = 0$
$C_4 = 7.61507 \times 10^{-8}$ $C_6 = -6.47823 \times 10^{-12}$
$C_8 = -2.61655 \times 10^{-17}$ $C_{10} = 1.19893 \times 10^{-20}$
$C_{12} = -3.46257 \times 10^{-25}$ $C_{14} = -7.25646 \times 10^{-29}$
$C_{16} = 4.06828 \times 10^{-33}$ 31st Surface:

$\kappa = 0$
$C_4 = -4.46513 \times 10^{-9}$ $C_6 = -8.65995 \times 10^{-13}$
$C_8 = -8.27019 \times 10^{-18}$ $C_{10} = 2.27837 \times 10^{-21}$
$C_{12} = -2.49013 \times 10^{-25}$ $C_{14} = 2.02730 \times 10^{-29}$
$C_{16} = -7.62983 \times 10^{-34}$ 34th Surface:

$\kappa = 0$
$C_4 = 1.78401 \times 10^{-8}$ $C_6 = -4.30308 \times 10^{-13}$
$C_8 = 4.97891 \times 10^{-17}$ $C_{10} = -1.35841 \times 10^{-21}$
$C_{12} = 2.25891 \times 10^{-26}$ $C_{14} = 1.87452 \times 10^{-30}$
$C_{16} = -6.96011 \times 10^{-35}$ 36th Surface:

$\kappa = 0$
$C_4 = 3.63510 \times 10^{-8}$ $C_6 = 2.20497 \times 10^{-13}$
$C_8 = -6.98444 \times 10^{-17}$ $C_{10} = 2.49660 \times 10^{-21}$
$C_{12} = -4.30453 \times 10^{-26}$ $C_{14} = 3.75232 \times 10^{-31}$
$C_{16} = -1.25235 \times 10^{-36}$ 45th Surface:

$\kappa = 0$
$C_4 = 5.41768 \times 10^{-9}$ $C_6 = -1.25187 \times 10^{-13}$
$C_8 = -2.46535 \times 10^{-17}$ $C_{10} = 2.91835 \times 10^{-21}$
$C_{12} = -1.30286 \times 10^{-25}$ $C_{14} = 2.86312 \times 10^{-30}$
$C_{16} = -2.57739 \times 10^{-35}$ 47th Surface:

$\kappa = 0$
$C_4 = 5.72850 \times 10^{-8}$ $C_6 = 5.35881 \times 10^{-12}$
$C_8 = -3.99564 \times 10^{-16}$ $C_{10} = 4.99873 \times 10^{-20}$
$C_{12} = -2.75405 \times 10^{-24}$ $C_{14} = 1.34776 \times 10^{-28}$
$C_{16} = -6.81632 \times 10^{-35}$ FIG. 8 is a diagram showing lateral aberration in the projection optical system of the first example. FIG. 9 is a diagram showing lateral aberration in the projection optical system of the second example. FIG. 10 is a diagram showing lateral aberration in the projection optical system of the third example. FIG. 11 is a diagram showing lateral aberration in the projection optical system of the fourth example. In the aberration diagrams of FIGS. 8 to 11, Y represents the image height. FIG. 12 is a diagram showing distortion (distortion aberration, displacement amount from an ideal image position) in the projection optical system of each example. FIG. 13 is a diagram showing telecentricity error (angle of incidence of principal ray to the wafer W when the reticle side is ideally telecentric) in the projection optical system of each example. The vertical axis in FIG. 12 represents the displacement amount (nm) of the image, and the vertical axis in FIG. 13 represents the angle of incidence (rad: radian) of the principal ray.

In FIGS. 12 and 13, the horizontal axis represents the image height (mm), the solid line represents the first example, the single-dotted line represents the second example, and the broken line represents the third example. With reference to FIGS. 8 to 13, it can be understood that in each example, the various aberrations including telecentricity and distortion are properly corrected with respect to the excimer laser light having a wavelength of 193.306 nm while obtaining a significantly large image side numerical aperture (NA=1.3) and a relatively large static exposure region ER (26 mm×5 mm or 26 mm×5.4 mm). In FIGS. 12 and 13, distortion and telecentricity errors in the fourth example are no shown. However, it has been confirmed that various aberrations including telecentricity and distortion have been properly corrected in the same manner as the other examples.

Therefore, in each example of the present embodiment, a high image side numerical aperture of 1.3 is obtained, and a rectangular effective exposure region (static exposure region) ER of 26 mm×5 mm or 26 mm×5.4 mm is obtained with respect to the ArF excimer laser light having a central wavelength of 193.306 nm, and a circuit pattern is scanned and exposed with a high resolution in the rectangular exposure region of 26 mm×33 mm. Further, in each example of the present embodiment, a catadioptric imaging optical system is employed. This substantially satisfies the Petzval conditions and obtains flatness of an image even though the image side numerical aperture is large. Furthermore, due to the employment of the off-axis field imaging optical system in which the effective field region (effective illumination region) and the effective projection region (effective exposure region ER) do not include the optical axis, the present embodiment can be applied to any pattern.

Figure 14A:
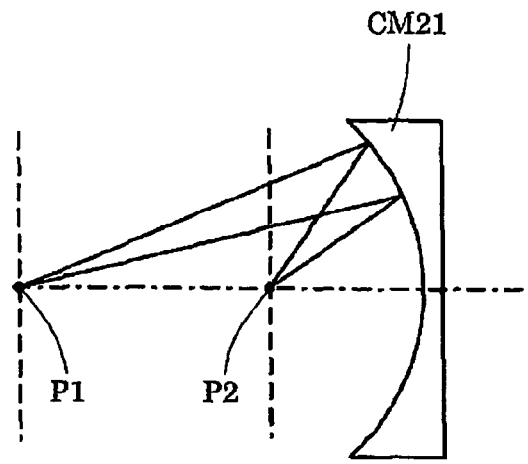
FIG. 14 is a schematic diagram illustrating the operation and effect of the present embodiment.

In particular, in each example of the present embodiment, one focal point of the prolate spheroidal-shaped reflection surface in the first concave reflection mirror CM21 is located at the pupil position of the first imaging system G1 and the other focal point is located at the pupil position of the second imaging system G2, and one focal point of the prolate spheroidal-shaped reflection surface of the second concave reflection mirror CM22 is located at the pupil position of the third imaging system G3 and the other focal point is located at the pupil position of the second imaging system G2. Therefore, the light from point P1 on the optical axis in the pupil plane of the first imaging system G1 is reflected by the prolate spheroidal-shaped reflection surface of the first concave reflection mirror CM21 and converged at point P2 on the optical axis in the pupil plane of the second imaging system G2, as shown in FIG. 14(a). Although not shown in the drawings, the light beam from point P2 on the optical axis in the pupil plane of the second imaging system G2 is reflected by the prolate spheroidal-shaped reflection surface of the second concave reflection mirror CM22 and converged at a point on the optical axis in the pupil plane of the third imaging system G3. As a result, spherical aberration of a pupil substantially does not occur at the pupil plane in the second imaging system G2.

Figure 14B:
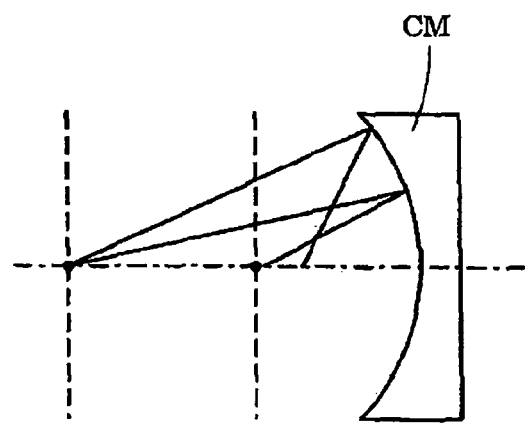

As shown in FIG. 14(b), in a structure using a concave reflection mirror CM having a reflection surface with a spherical shape, the light from a point on the optical axis in the pupil plane of the first imaging system does not converge at a point on the optical axis in the pupil plane via the concave reflection mirror CM in the second imaging system. This produces a relatively large pupil spherical aberration. Thus, in the prior art, higher-order aspheric surfaces (aspheric surfaces having aspheric coefficients with a higher-order term (secondary or higher)) must be used for the reflection mirror in the second imaging system. Otherwise, a reciprocal optical element must be used between two reflection mirrors in the second imaging system. Comparatively, each example of the present embodiment uses a two prolate spheroidal-shaped reflection surfaces (aspheric surfaces that do not include a higher-order term (secondary or higher) aspheric coefficient) in the second imaging system. This obtains a projection optical system having a high numerical aperture in which various aberrations including telecentricity and distortion are properly corrected while substantially suppressing pupil spherical aberration without using a reflection surface having a higher-order aspherical shape or a reciprocal optical element.

Figure 14C:
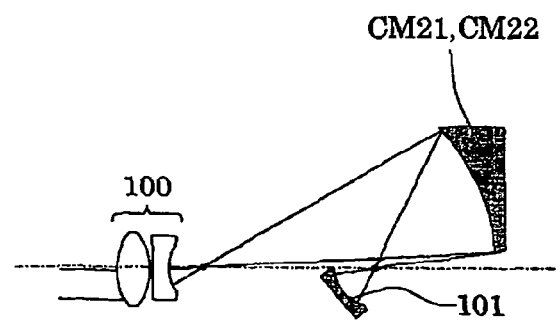

A spherical surface measuring technique using two focal points can be used for surface measurements of the concave reflection mirrors CM21 and CM22 having prolate spheroidal-shaped reflection surface. In other words, instead of a relatively complicated aspheric surface measuring technique using a null element or the like, the concave reflection mirrors CM21 and CM22 having a prolate spheroidal-shaped reflection surface can be manufactured with high accuracy based on a relatively simple spherical surface measuring technique using a Fizeau optical system 100 and a reflex spherical reflection mirror 101, as shown in FIG. 14(c). In particular, in the first to third examples of the present embodiment, the first concave reflection mirror CM21 and the second concave reflection mirror CM22 have identically shaped reflection surfaces. This reduces the manufacturing cost of the concave reflection mirrors CM21 and CM22, and ultimately, the manufacturing cost of the optical system.

In the fourth example of the present embodiment, the first concave reflection mirror CM21 and the second concave reflection mirror CM22 have different prolate spheroidal-shaped reflection surfaces. However, the first concave reflection mirror CM21 and the second concave reflection mirror CM22 both include an opening portion for passage of focusing light and an effective reflection surface corresponding to part of a substantially rotationally symmetric curved surface with respect to the optical axis AX. As a result, the first concave reflection mirror CM21 and the second concave reflection mirror CM22 can be supported at a plurality of positions that are distanced from the optical axis AX by a substantially equal distance, for example, at a plurality of substantially rotationally symmetric positions relative to the optical axis AX. Thus, assembly and adjustment of the optical system can be performed easily with high accuracy using the conventional method. In the fourth example, the first concave reflection mirror CM21 and the second concave reflection mirror CM22 both include an opening portion for passage of the focusing light. However, the structure is not limited in such a manner, and a modification in which an opening portion is provided for only one of the first concave reflection mirror CM21 and the second concave reflection mirror CM22 may be employed.

In the present example, it is desirable that the prolate spheroidal-shaped reflection surfaces of the concave reflection mirrors CM21 and CM22 be expressed by the following equation (a) excluding the high order term ($C_n \cdot y^n$) including the aspheric coefficient $C_n$ from the equation (b), which represents the aspheric surface, and the conical coefficient $\kappa$ satisfy the following condition (1).

$$z=(y^2/r)/[1+\{1-(1+\kappa)\cdot y^2/r^2\}^{1/2}] \tag{a}$$

$$-0.75<\kappa<-0.25 \tag{1}$$

When exceeding the upper limit value of the condition (1), the two focal point positions of a prolate spheroidal-shaped reflection surface become too close to each other and the prolate spheroidal-shaped reflection surface becomes too close to a spherical surface. Thus, the exit pupil position of the first imaging system or the entrance pupil position of the third imaging system must be arranged close to the second imaging system. The angle formed by peripheral principal ray and the optical axis becomes large. This leads to enlargement of the concave reflection mirror and is thus not preferable. When under the lower limit value of the condition (1), the two focal point positions of the prolate spheroidal-shaped reflection surface become too far from each other, and the prolate spheroidal-shaped reflection surface becomes close to a parabolic surface. Thus, the exit pupil position of the first imaging system or the entrance pupil position of the third imaging system becomes distant from the second imaging system. As a result, the refracting power of the field lens group on the second imaging system side must be increased in the first imaging system and the third imaging system. This is undesirable in that correction of the spherical aberration in the pupil becomes difficult and in that telecentricity and distortion cannot be both corrected. In order to obtain a further satisfactory effect with the present invention, it is preferable that the upper limit value of the condition (1) be −0.35 and the lower limit value be −0.65.

In the above embodiment, the first concave reflection mirror CM21 and the second concave reflection mirror CM22 both have a prolate spheroidal-shaped reflection surface. However, the present invention is not limited in such a manner, and the advantages of the present invention can be obtained as long as the reflection surface of one of the concave reflection mirrors is a prolate spheroidal-shaped surface. In the first to third examples of the above-described embodiment, the first concave reflection mirror CM21 and the second concave reflection mirror CM22 have identically shaped reflection surfaces. However, the present invention is not limited in such a manner, and the advantages of the present invention can be obtained even when the two concave reflection mirrors have differently shaped reflection surfaces as long as one of the concave reflection mirrors is a prolate spheroidal-shaped surface. In the fourth example of the above-described embodiment, the two concave reflection mirrors have different prolate spheroidal-shaped reflection surfaces. However, the manufacturing cost of the concave reflection mirror can be reduced when the first concave reflection mirror CM21 and the second concave reflection mirror CM22 have identically shaped reflection surfaces. From this aspect, it is important that two concave reflection mirrors having identically shaped reflection surfaces be arranged in the second imaging system of, for example, a thrice imaging type catadioptric imaging optical system.

In the above-described embodiment, the first imaging system G1 and the third imaging system G3 are formed as dioptric systems that do not include a reflection mirror. However, the present invention is not limited in such a manner and various modifications of the first imaging system G1 and the third imaging system G3 are possible. Further, in the above-described embodiment, the second imaging system G2 is formed by only two concave reflection mirrors. However, the present invention is not limited in such a manner and various modifications of the second imaging system G2.

In the above embodiment, the present invention is applied to a liquid immersion catadioptric imaging optical system. However, the present invention is not limited in such a manner and may also be applied to a dry catadioptric imaging optical system that does not use immersion liquid at the image side region. In the above-described embodiment, the present invention is applied to an off-axis field catadioptric imaging optical system for forming an image only in a region distant from the optical axis. However, the present invention is not limited in such a manner and may also be applied to a catadioptric imaging optical system for forming an image on a region including the optical axis. In the above embodiment, the present invention is applied to a thrice imaging type catadioptric imaging optical system. However, the present invention is not limited in such a manner and may also be applied to an off-axis field catadioptric imaging optical system including two curved reflection mirrors and a plurality of dioptric elements.

In the exposure apparatus of the above-described embodiment, a micro-device (semiconductor device, imaging device, liquid crystal display device, thin-film magnetic head, etc.) can be manufactured by illuminating a reticle (mask) with an illumination device (illumination process), and exposing a transfer pattern formed on a mask onto a photosensitive substrate using the projection optical system (exposure process). One example of the procedures for obtaining a semiconductor device serving as the micro-device by forming a predetermined circuit pattern on a wafer etc. serving as the photosensitive substrate using the exposure apparatus of the present embodiment will be described below with reference to the flowchart of FIG. 15.

Figure 15:
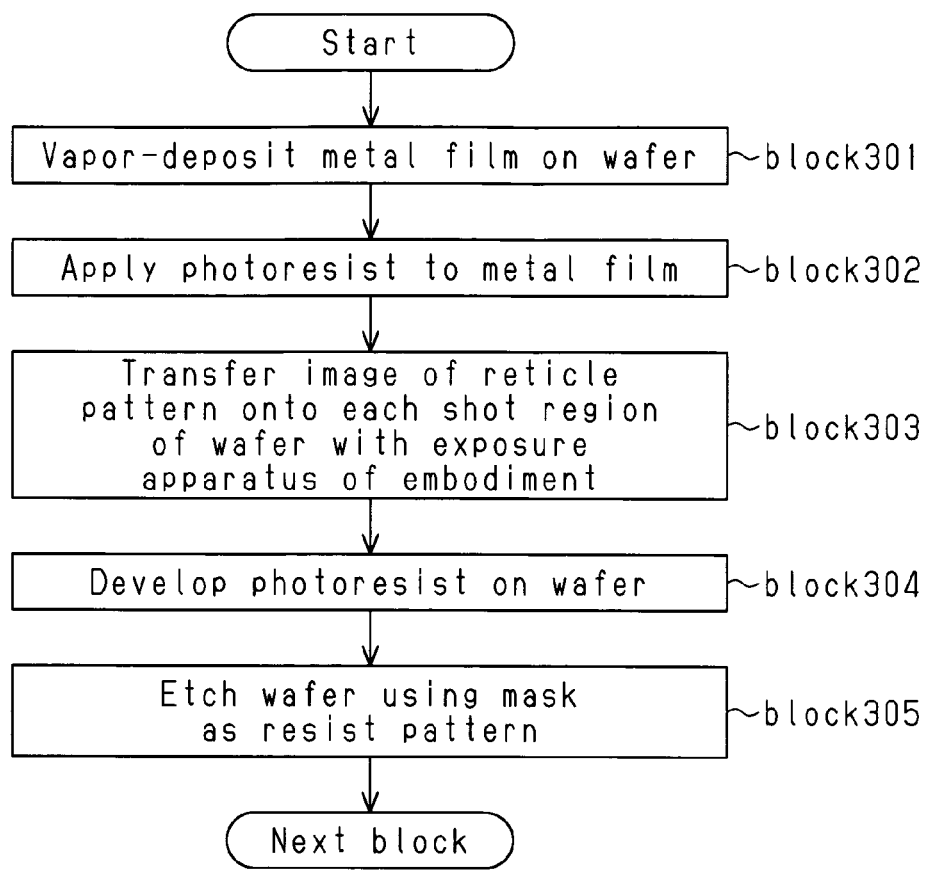
FIG. 15 is a flowchart showing the procedures for obtaining a semiconductor device.

First, in block 301 of FIG. 15, a metal film is vapor-deposited on a single lot of wafers. Next, in block 302, photoresist is applied to the metal film on the single lot of wafers. Then, in block 303, the image of a pattern on a mask (reticle) is sequentially exposed and transferred to each shot region in the single lot of wafers with the projection optical system of the exposure apparatus of the present embodiment. After the photoresist on the single lot of wafers is developed in block 304, etching is carried out on the single lot of wafers using a resist pattern as the mask in block 305 so that a circuit pattern corresponding to the pattern on the mask is formed in each shot region of each wafer.

Subsequently, a device such as semiconductor device is manufactured by forming circuit patterns in upper layers. The semiconductor device manufacturing method described above obtains semiconductor devices having extremely fine circuit patterns with satisfactory throughput. In block 301 to block 305, metal is vapor-deposited on the wafers, resist is applied to the metal film, and the processes of exposure, development, and etching are performed. However, it is obvious that prior to such processes, a silicon oxide film may be formed on the wafers and then resist may be applied on the silicon oxide film and the processes of exposure, development, and etching can be performed.

Figure 16:
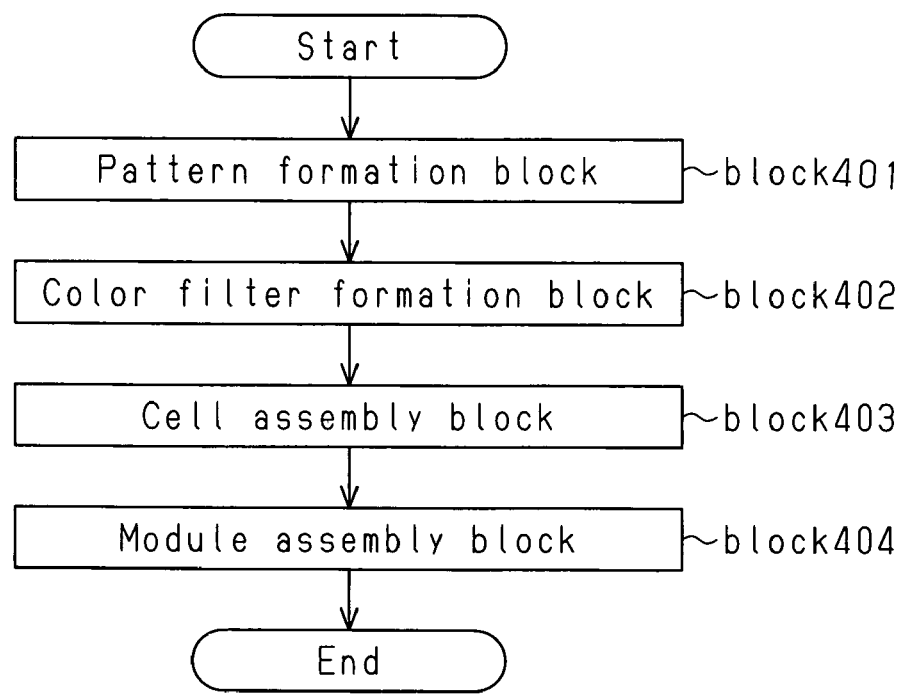
FIG. 16 is a flowchart showing the procedures for obtaining a liquid crystal display element.

In the exposure apparatus of the present embodiment, a liquid crystal display device serving as a micro-device can be obtained by forming a predetermined pattern (circuit pattern, electrode pattern etc.) on a plate (glass substrate). One example of the procedures taken in this case will now be described with reference to the flowchart of FIG. 16. In FIG. 16, a so-called photolithography process of transferring and exposing a pattern of a mask onto a photosensitive substrate (glass substrate applied with resist and the like) using the exposure apparatus of the present embodiment is performed in a pattern formation block 401. A predetermined pattern including many electrodes is formed on the photosensitive substrate through the photolithography process. The exposed substrate then undergoes the processes including a development block, an etching block, and a resist removal block to form a predetermined pattern on the substrate. Then, the next color filter formation block 402 is performed.

In the color filter formation block 402, a color filter is formed in which many sets of three dots corresponding to R (Red), G (Green), and B (Blue) is arranged in a matrix form or in which a plurality of sets of three stripe filters of R, G, and B are arranged extending in a horizontal scanning line direction. After the color filter formation block 402, a cell assembling block 403 is performed. In the cell assembling block 403, a liquid crystal panel (liquid crystal cell) is assembled using the substrate having the predetermined pattern obtained in the pattern formation block 401 and the color filter obtained in the color filter formation block 402.

In the cell assembling block 403, a liquid crystal panel (liquid crystal cell) is manufactured by injecting liquid crystal between the substrate having the predetermined pattern obtained in the pattern formation block 401 and the color filter obtained in the color filter formation block 402. Thereafter, in a module assembling block 404, components such as electric circuits and a backlight for enabling a display operation of the assembled liquid crystal panel (liquid crystal cell) are mounted to complete a liquid crystal display device. In the above-described manufacturing method for a liquid crystal display device, liquid crystal display devices having extremely fine circuit patterns are obtained with satisfactory throughput.

An ArF excimer laser light source is used in the above-described embodiment. However, the present invention is not limited in such a manner and other suitable light sources such as an $F_2$ laser light source may be used. If $F_2$ laser light is used as the exposure light, fluorine-containing liquid such as fluorine-based oils and perfluoropolyether (PFPE) that can transmit $F_2$ laser light is used as the liquid. In the above-described embodiment, the present invention is applied to a projection optical system used in an exposure apparatus. However, the present invention is not limited in such a manner and may be applied to other suitable catadioptric imaging optical systems.

In a typical embodiment of the present invention, a second imaging system consists of two concave reflection mirrors having prolate spheroidal-shaped reflection surfaces in a thrice imaging type catadioptric imaging optical system. The prolate spheroidal-shaped reflection surface of the first concave reflection mirror is arranged such that one focal point is located at a pupil position of the first imaging system, and the other focal point is located at a pupil position of the second imaging system. The prolate spheroidal-shaped reflection surface of the second concave reflection mirror is arranged such that one focal point is located at a pupil position of the third imaging system, and the other focal point is located at a pupil position of the second imaging system.

In this manner, the embodiment of the present invention realizes a catadioptric imaging optical system of a high numerical aperture in which various aberrations including telecentricity and distortion are properly corrected while substantially suppressing spherical aberration of the pupil without using a reflection surface having an aspherical shape of high order or a reciprocal optical element. In the exposure apparatus of the embodiment of the present invention, a fine pattern can be projected and exposed with high accuracy using a catadioptric imaging optical system of high numerical aperture in which various aberrations are properly corrected. This, in turn, manufactures a satisfactory device with high accuracy.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. A reflection mirror assembly for use in a catadioptric imaging optical system, the assembly comprising:
    two curved reflection mirrors, each including a prolate spheroidal-shaped reflection surface expressed by equation (a), where y represents height in a direction perpendicular to the optical axis, z represents distance (sag amount) along the optical axis from a tangent plane at a vertex of the reflection surface to a position on the reflection surface at height y, r represents a vertex curvature radius, and κ represents a conical coefficient;

$$z=(y^2/r)/[1+\{1-(1+\kappa)\cdot y^2/r^2\}^{1/2}] \quad (a).$$

2. The assembly according to claim 1, wherein the two curved reflection mirrors include identically shaped reflection mirrors.

3. A catadioptric imaging optical system that forms an image of a first plane on a second plane, the catadioptric imaging optical system comprising:
    a first imaging system which forms a first intermediate image of the first plane based on light from the first plane;
    a second imaging system which includes two concave reflection mirrors and which forms a second intermediate image of the first plane based on light from the first intermediate image; and
    a third imaging system which forms a final image of the first plane on the second plane based on light from the second intermediate image;
    wherein at least one of the two concave reflection mirrors includes a prolate spheroidal-shaped reflection surface expressed by equation (a), where y represents height in a direction perpendicular to the optical axis, z represents distance (sag amount) along the optical axis from a tangent plane at a vertex of the reflection surface to a position on the reflection surface at height y, r represents a vertex curvature radius, and κ represents a conical coefficient;

$$z=(y^2/r)/[1+\{1-(1+\kappa)\cdot y^2/r^2\}^{1/2}] \quad (a).$$

4. The catadioptric imaging optical system according to claim 3, wherein one focal point of the prolate spheroidal-shaped reflection surface is located on or near a pupil position of the first imaging system or third imaging system and the other focal point of the prolate spheroidal-shaped reflection surface is located on or near a pupil position of the second imaging system.

5. The catadioptric imaging optical system according to claim 4, wherein the two concave reflection mirrors each include a prolate spheroidal-shaped reflection surface.

6. The catadioptric imaging optical system according to claim 5, wherein the two concave reflection mirrors include identically shaped reflection surfaces.

7. The catadioptric imaging optical system according to claim 3, wherein the first imaging system and the third imaging system are each a dioptric system that is free from a reflection mirror.

8. The catadioptric imaging optical system according to claim 7, wherein the second imaging system consists of only the two concave reflection mirrors.

9. The catadioptric imaging optical system according to claim 3, wherein the catadioptric imaging optical system is an off-axis field catadioptric imaging optical system which forms an image of the first plane on the second plane only in a region distant from an optical axis.

10. The catadioptric imaging optical system according to claim 3, wherein the first to third imaging systems are arranged coaxially with one another.

11. The catadioptric imaging optical system according to claim 3, wherein the conical coefficient κ satisfies a condition of $-0.75<\kappa<-0.25$.

12. The catadioptric imaging optical system according to claim 3, wherein at least one of the two concave reflection mirrors includes an opening portion which is for passage of focusing light and is supported at a plurality of positions distanced from an optical axis by a substantially equal distance.

13. The catadioptric imaging optical system according to claim 12, wherein at least one of the two concave reflection mirrors is supported at a plurality of positions that are substantially rotationally symmetric with respect to the optical axis.

14. The catadioptric imaging optical system according to claim 3, wherein at least one of the two concave reflection mirrors includes an effective reflection surface corresponding to part of a curved surface that is substantially rotationally symmetric with respect to an optical axis.

15. An exposure apparatus comprising:
the catadioptric imaging optical system according to claim 3 which projects an image of the pattern onto a photosensitive substrate set as the second plane based on light from a predetermined pattern set as the first plane.

16. A device manufacturing method comprising:
exposing the predetermined pattern onto the photosensitive substrate using the exposure apparatus according to claim 15;
developing the photosensitive substrate onto which the pattern has been transferred;
forming on a surface of the photosensitive substrate a mask layer shaped in correspondence with the pattern; and
processing the surface of the photosensitive substrate through the mask layer.

17. The catadioptric imaging optical system according to claim 3, wherein the first imaging system includes a plate parallel to the first plane and ten lenses.

18. An off-axis field catadioptric imaging optical system that forms an image of a first plane on a second plane only in a region distant from an optical axis, the off-axis field catadioptric imaging optical system comprising:
two curved reflection mirrors and a plurality of dioptric elements;
wherein at least one of the two curved reflection mirrors includes a prolate spheroidal-shaped reflection surface expressed by equation (a), where y represents height in a direction perpendicular to the optical axis, z represents distance (sag amount) along the optical axis from a tangent plane at a vertex of the reflection surface to a position on the reflection surface at height y, r represents a vertex curvature radius, and κ represents a conical coefficient;

$$z=(y^2/r)/[1+\{1-(1+\kappa)\cdot y^2/r^2\}^{1/2}] \qquad (a).$$

19. The catadioptric imaging optical system according to claim 18, wherein the two curved reflection mirrors and the plurality of dioptric elements are arranged coaxially with the optical axis.

20. The catadioptric imaging optical system according to claim 19, wherein the two curved reflection mirrors are concave reflection mirrors.

21. The catadioptric imaging optical system according to claim 20, wherein the two concave reflection mirrors each include the prolate spheroidal-shaped reflection surface.

22. The catadioptric imaging optical system according to claim 21, wherein the two curved reflection mirrors include identically shaped reflection surfaces.

23. The catadioptric imaging optical system according to claim 18, wherein the conical coefficient κ satisfies a condition of $-0.75<\kappa<-0.25$.

24. The catadioptric imaging optical system according to claim 18, wherein at least one of the two concave reflection mirrors includes an opening portion which is for passage of focusing light and is supported at a plurality of positions distanced from the optical axis by a substantially equal distance.

25. The catadioptric imaging optical system according to claim 24, wherein at least one of the two concave reflection mirrors is supported at a plurality of positions that are substantially rotationally symmetric with respect to the optical axis.

26. The catadioptric imaging optical system according to claim 18, wherein at least one of the two concave reflection mirrors includes an effective reflection surface corresponding to part of a curved surface that is substantially rotationally symmetric with respect to an optical axis.

27. An exposure apparatus comprising:
the catadioptric imaging optical system according to claim 18 which projects an image of the pattern onto a photosensitive substrate set as the second plane based on light from a predetermined pattern set as the first plane.

28. A device manufacturing method comprising:
exposing the predetermined pattern onto the photosensitive substrate using the exposure apparatus according to claim 27;
developing the photosensitive substrate onto which the pattern has been transferred;
forming on a surface of the photosensitive substrate a mask layer shaped in correspondence with the pattern; and
processing the surface of the photosensitive substrate through the mask layer.

29. A reflection mirror for use in a catadioptric imaging optical system including a first imaging system which forms a first intermediate image of a first plane based on light from the first plane, a second imaging system which forms a second intermediate image of the first plane based on light from the first intermediate image, and a third imaging system which forms a final image of the first plane on the second plane based on light from the second intermediate image, the reflection mirror comprising:
at least one of two concave reflection mirrors arranged in the second imaging system and including a prolate spheroidal-shaped reflection surface expressed by equation (a), where y represents height in a direction perpendicular to the optical axis, z represents distance (sag amount) along the optical axis from a tangent plane at a vertex of the reflection surface to a position on the reflection surface at height y, r represents a vertex curvature radius, and κ represents a conical coefficient;

$$z=(y^2/r)/[1+\{1-(1+\kappa)\cdot y^2/r^2\}^{1/2}] \qquad (a).$$

30. The reflection mirror according to claim 29, wherein one focal point of the prolate spheroidal-shaped reflection surface is located on or near a pupil position of the first imaging system or third imaging system and the other focal point of the prolate spheroidal-shaped reflection surface is located on or near a pupil position of the second imaging system.

31. The reflection mirror according to claim 29, wherein the conical coefficient κ satisfies a condition of $-0.75<\kappa<-0.25$.

32. The reflection mirror according to claim 29, further comprising an opening portion which is for passage of focusing light, wherein the reflection mirror is supported at a plurality of positions distanced from an optical axis by a substantially equal distance.

33. The reflection mirror according to claim 32, wherein the reflection mirror is supported at a plurality of positions that are substantially rotationally symmetric with respect to the optical axis.

34. The reflection mirror according to claim 32, wherein the opening portion is formed at a location distanced from the optical axis.

35. A reflection mirror for use in an off-axis catadioptric imaging optical system that forms an image of a first plane on a second plane only at a region distanced from an optical axis, with the catadioptric imaging optical system including two curved reflection mirrors and a plurality of dioptric elements, the reflection mirror comprising:

a prolate spheroidal-shaped reflection surface expressed by equation (a), where y represents height in a direction perpendicular to the optical axis, z represents distance (sag amount) along the optical axis from a tangent plane at a vertex of the reflection surface to a position on the reflection surface at height y, r represents a vertex curvature radius, and κ represents a conical coefficient;

$$z=(y^2/r)/[1+\{1-(1+\kappa)\cdot y^2/r^2\}^{1/2}] \quad (a),$$

wherein the reflection mirror is at least one of the two curved reflection mirrors of the catadioptric imaging optical system.

36. The reflection mirror according to claim 35, wherein the two curved reflection mirrors and the plurality of plurality of dioptric elements are arranged coaxially with the optical axis.

37. The reflection mirror according to claim 35, wherein the two curved reflection mirrors are concave reflection mirrors.

38. The reflection mirror according to claim 35, wherein the conical coefficient κ satisfies a condition of $-0.75<\kappa<-0.25$.

39. The reflection mirror according to claim 35, further comprising:

an opening portion which is for passage of focusing light, wherein the reflection mirror is supported at a plurality of positions distanced from the optical axis by a substantially equal distance.

40. The reflection mirror according to claim 39, wherein the reflection mirror is supported at a plurality of positions that are substantially rotationally symmetric with respect to the optical axis.

41. The reflection mirror according to claim 39, wherein the opening portion is formed at a location distanced from the optical axis.

* * * * *